(12) United States Patent
Suzuri et al.

(10) Patent No.: US 6,949,878 B2
(45) Date of Patent: Sep. 27, 2005

(54) MULTICOLOR LIGHT EMISSION APPARATUS WITH MULTIPLE DIFFERENT WAVELENGTH ORGANIC ELEMENTS

(75) Inventors: Yoshiyuki Suzuri, Tokyo (JP); Kazuo Genda, Tokyo (JP); Hiroshi Kita, Tokyo (JP)

(73) Assignee: Konica Corporation, Tokyo (JP)

( * ) Notice: Subject to any disclaimer, the term of this patent is extended or adjusted under 35 U.S.C. 154(b) by 92 days.

(21) Appl. No.: 10/225,859

(22) Filed: Aug. 22, 2002

(65) Prior Publication Data

US 2003/0076032 A1 Apr. 24, 2003

(30) Foreign Application Priority Data

Aug. 28, 2001 (JP) ........................................ 2001-257720

(51) Int. Cl.[7] ................................................ H01J 1/62
(52) U.S. Cl. ...................... 313/503; 313/504; 313/506; 428/609
(58) Field of Search ................................. 313/503, 504, 313/506; 428/690

(56) References Cited

U.S. PATENT DOCUMENTS

| | | | | |
|---|---|---|---|---|
| 5,294,870 A | * | 3/1994 | Tang et al. ................... | 313/504 |
| 6,166,489 A | * | 12/2000 | Thompson et al. ........... | 313/506 |
| 6,278,236 B1 | * | 8/2001 | Madathil et al. .............. | 313/504 |
| 6,459,199 B1 | * | 10/2002 | Kido et al. .................... | 313/504 |
| 6,606,110 B2 | * | 8/2003 | Gaudiana et al. ............ | 347/238 |
| 6,626,722 B2 | * | 9/2003 | Takematsu et al. ........... | 445/24 |

* cited by examiner

Primary Examiner—David V. Bruce
Assistant Examiner—Elizabeth Keaney
(74) Attorney, Agent, or Firm—Frishauf, Holtz, Goodman & Chick, P.C.

(57) ABSTRACT

A multicolor light emission apparatus is disclosed which comprises a first organic EL element having a first maximum emission wavelength in a blue light wavelength region; and a second organic EL element having a second maximum emission wavelength longer than the first maximum emission wavelength; wherein the first organic EL element comprises a first light emission layer containing a first host and a first dopant, and the second organic EL element comprises a second emission layer containing a second host and a second dopant, and wherein each of the first and second hosts has an emission wavelength region which is shorter than the blue light wavelength region.

34 Claims, 6 Drawing Sheets

MULTICOLOR LIGHT EMISSION APPARATUS WITH MULTIPLE DIFFERENT WAVELENGTH ORGANIC ELEMENTS

FIELD OF THE INVENTION

This invention relates to a multicolor light emission apparatus employing an organic EL element used in a light source of an electrophotographic copier, a printer, or a display such as a flat display, and a manufacturing method thereof.

BACKGROUND OF THE INVENTION

An organic EL element has a structure in which a layer containing an organic fluorescent compound is arranged between a cathode and an anode, and an electron and a positive hole were injected into the light emission layer and recombined to form an exciton. The element emits light, utilizing light (fluorescent light or phosphorescent light) generated by deactivation of the exciton, and the element can emit light by applying a relatively low voltage of from several to several decade volts. The element has a wide viewing angle and a high visuality since the element is of self light emission type. Further, the element is a complete solid element, and is noted from the viewpoint of space saving and portability. Therefore, study for practical application of the element has been made.

Practical application of a multicolor light emission apparatus, which forms an image by light emission from plural organic EL elements emitting red light (R), plural organic EL elements emitting green light (G), and plural organic EL elements emitting blue light (B) arranged, has been attempted.

A conventional multicolor light emission apparatus, employing plural organic EL elements, is difficult to be manufactured, and further, a multicolor light emission apparatus with high precision is not manufactured stably.

It is known that in the light emission layer there is are a hole transporting type light emission layer with high hole transportability, an electron transporting type light emission layer with high electron transportability, and a bipolar type light emission layer with high hole transportability and high electron transportability. This type is determined due to the kinds of the dopant and the host constituting the light emission layer, a combination of the dopant and the host constituting the light emission layer, or the content ratio of the dopant to the host in the light emission layer. For example, when the electroluminescent element comprises an electron transporting type light emission layer, the requirement must be satisfied that the excited energy of material constituting a hole transporting layer adjacent to the electron transporting type light emission layer is higher than that of the dopant which is contained in the electron transporting type light emission layer, and contributes to light emission. Otherwise, a high light emission efficiency cannot be obtained which results from excited energy transfer from the dopant to the material of the hole transporting layer, or light emission from the hole transporting layer often occurs, resulting in fluctuation of chromaticity. This also applies to the relationship between the hole transporting type light emission layer and the electron transporting layer adjacent thereto or the relationship between the bipolar light emission layer and the hole transporting layer adjacent thereto or the electron transporting layer adjacent thereto. The dopant content not only determines a hole or electron transporting ability, but also has an influence on emission lifetime or emission efficiency, and therefore, cannot be determined only by the transporting ability.

The electroluminescent element is designed considering the above. However, as the hole or electron transporting ability is determined by kinds of the dopant or host or their content, it is extremely difficult to employ the same hole transporting material, the same host or the same electron transporting material in the BGR elements, and therefore, the degree of freedom of design or manufacture of the BGR elements is low. For example, when a full color display is manufactured employing the three color emission elements, an organic EL element emitting red light, an organic EL element emitting green light, and an organic EL element emitting blue light, it is necessary that in each color emission element, the layer constitution, the content of compounds used in the layer or the layer thickness be designed, separately. This is a troublesome process in which the layers in each color emission element are formed, separately, employing a shadow mask. It is expected that when each color emission element is manufactured employing the same compounds of known compounds or so as to have a layer with the same thickness in order to minimize load on the manufacture, there occurs the problem in that color fluctuation is produced or emission efficiency is lowered.

In employing the same compounds in each color emission element, there is disclosed in Japanese Patent O.P.I. Publication No. 2000-82582 a multicolor light emission apparatus reducing the total number of compounds used in which the same compound is employed as the host material and electron transporting material in the red light emission layer, which can reduce burden in the manufacture.

However, this multicolor light emission apparatus emits red light employing aluminum tris (8-quinolinolate) (Alq3) in the light emission layer of the organic EL element, and when voltage is applied to emit light, the difference between chromaticity on the high voltage side and that on the low voltage side tends to be greater. This is because light is emitted not only from the dopant but also from the aluminum tris (8-quinolinolate) on the high voltage side. Particularly in red color, the chromaticity difference has a great influence on chromaticity (see FIG. 13).

SUMMARY OF THE INVENTION

The present invention has been made in view of the above. A first object of the invention is to provide a multicolor light emission apparatus which is reduced in color fluctuation of emitted light due to driving voltage. A second object of the invention is to provide a multicolor light emission apparatus with high degree of freedom in the design of the electroluminescent element which minimizes load on the manufacture.

DETAILED DESCRIPTION OF THE INVENTION

Figure 1:
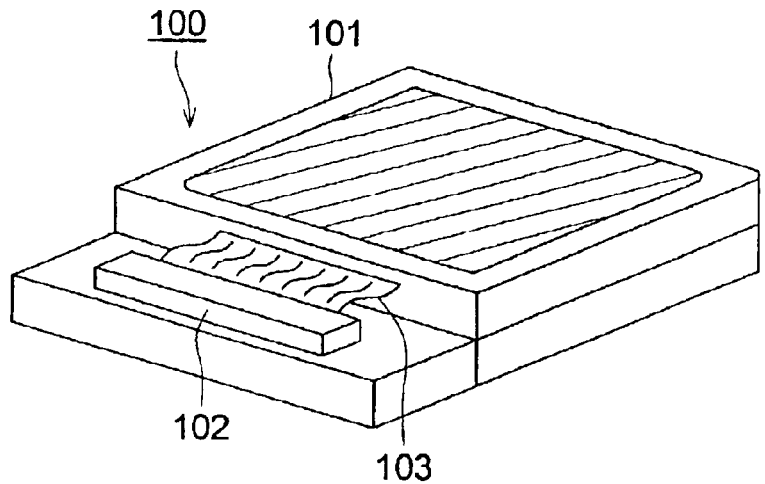
FIG. 1 is a schematic drawing of a multicolor light emission apparatus.

The above object of the invention can be attained by the following constitution:

1. A multicolor light emission apparatus comprising a first organic EL element having a first maximum emission wavelength in a blue light wavelength region and a second organic EL element having a second maximum emission wavelength longer than the first maximum emission wavelength, the first organic EL element comprising a first light emission layer containing a first host and a first dopant, and the second organic EL element comprising a second light emission layer containing a second host and a second dopant, and the emission wavelength region of the first and second host is in a wavelength region shorter than the blue light wavelength region; the multicolor light emission apparatus above, wherein the maximum emission wavelength of the first and second hosts is not longer than 415 nm; the multicolor light emission apparatus above, wherein the first host and the second host are the same; the multicolor light emission apparatus above, wherein a first hole transporting layer is provided adjacent to one side of the first light emission layer, a first electron transporting layer is provided adjacent to another side of the first light emission layer, a second hole transporting layer is provided adjacent to one side of the second light emission layer, and a second electron transporting layer is provided adjacent to another side of the second light emission layer, the first and second hole transporting layers containing the same first compound, and the first and second electron transporting layers containing the same second compound; the multicolor light emission apparatus above, wherein the thickness of the first hole transporting layer is the same as that of the second hole transporting layer, and the thickness of the first electron transporting layer is the same as that of the second electron transporting layer; the multicolor light emission apparatus above, wherein the compound contained in the first and second hole transporting layers has a maximum emission wavelength of not longer than 415 nm, the multicolor light emission apparatus above, wherein the compound contained in the first and second electron transporting layers has a maximum emission wavelength of not longer than 415 nm; the multicolor light emission apparatus above, comprising, as the second organic EL element, an organic EL element having a maximum emission wavelength in a green light wavelength region and an organic EL element having a maximum emission wavelength in a red light wavelength region, wherein the apparatus is a display exhibiting an image by light emission from each organic element, or wherein the apparatus is a light source; or 2. a method of manufacturing the multicolor light emission apparatus described in item 1 above, wherein the method comprises the steps of simultaneously forming the hole transporting layer of each of the organic EL elements, forming the light emission layer of each of the organic EL elements through a mask, separately, and simultaneously forming the electron transporting layer of each of the organic EL elements; or the method above, wherein the hole transporting layer, the light emission layer, and the electron transporting layer are formed by a vacuum deposition method.

PRACTICAL EMBODIMENT OF THE INVENTION

The present invention will be detailed below based on the practical embodiment of the invention, but is not limited thereto.

One example of the embodiments of the invention will be explained below employing Figures.

FIG. 1 is a schematic drawing of a multicolor light emission apparatus displaying image information due to light emission from an organic EL element. A multicolor light emission apparatus 100 comprises a display section 101 having plural pixels and a control section 102 carrying out image scanning in the display section 101 according to image information. The control section 102 is electrically connected through a connection section 103 to the display section 101, transmits a scanning signal and a data signal to each of the plural pixels based on the image information transmitted from the exterior, and emits light from the pixels due to image scanning, whereby an image is displayed on the display section 101. In the image scanning, plural scanning lines being successively scanned, scanning signals are transmitted to pixels connected to the scanning lines, whereby light is emitted from the pixels according to the transmitted data signals.

Figure 2:
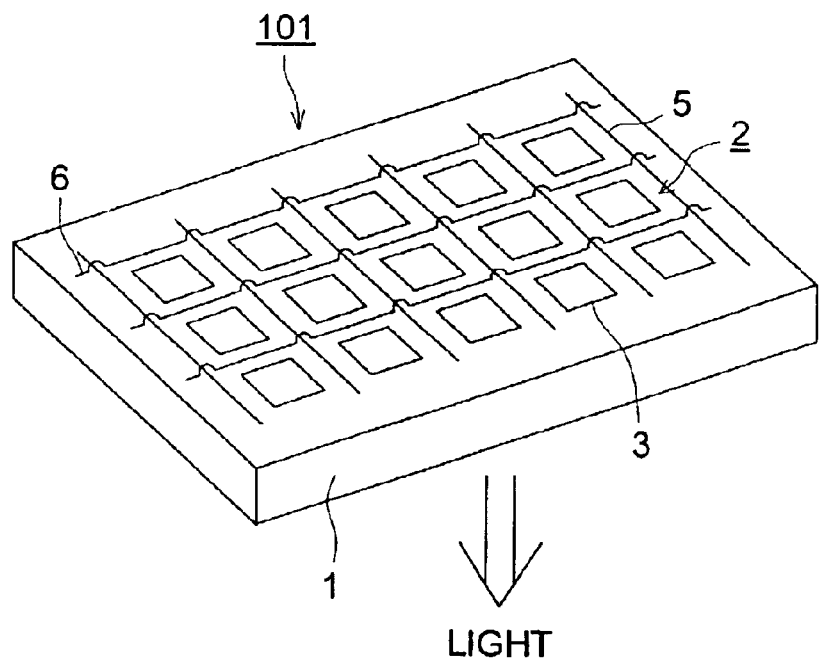
FIG. 2 is a schematic drawing of a display section of a multicolor light emission apparatus.

FIG. 2 is a schematic drawing of a display section 101. The display section 101 comprises a glass substrate 1, a wiring section 2, and plural pixels 3. The main members of the display section will be explained below.

The glass substrate 1 is comprised of a transparent or semitransparent material such as glass, quartz or resin, and light emitted from the pixels emerges. A color filter, a color conversion layer comprising a fluorescent compound or a reflection dielectric layer may be provided on the glass substrate 1 to convert the wavelength of the emitted light or resonate the emitted light. The wiring section 2 is comprised of plural scanning lines 5 and plural data lines 6 each composed of an electroconductive material, the lines 5 and the lines 6 being crossed with each other at a right angle, and connected with the pixel 3 at the crossed points.

The plural pixels 3, when the scanning signal is applied from the scanning lines 5, receive the data signal from the data lines 6, and emit light corresponding to the image data received. The plural pixels 3 emit light of B, G, and R, and each of the plural pixels 3 is arranged at a proper position of the display section 1 to suitably indicate a color image.

Next, an emission process of the pixels 3 will be explained.

Figure 3:
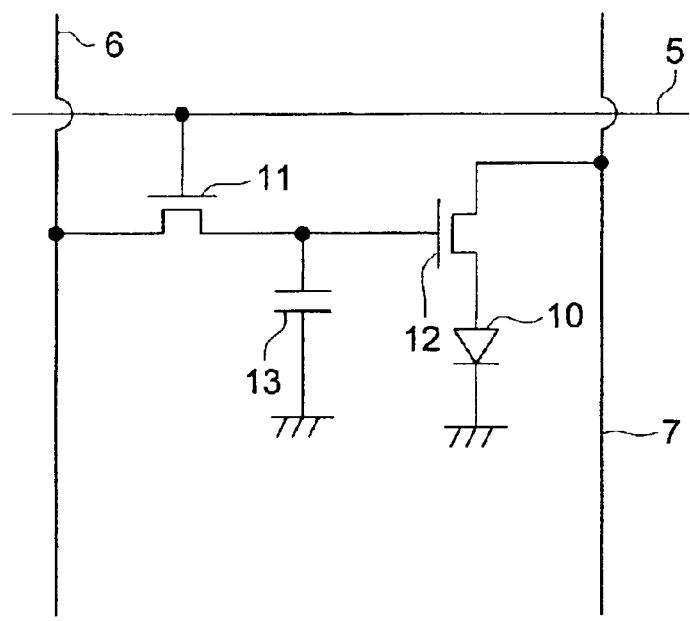
FIG. 3 is a schematic drawing of a pixel in the display section of a multicolor light emission apparatus.

FIG. 3 is a schematic drawing of a pixel 3. The pixel 3 comprises an organic EL element containing plural organic compounds, a switching transistor 11, a driving transistor 12, and a capacitor 13.

In FIG. 3, an image data signal is applied through the data lines 6 from the control section 102 to a drain of the switching transistor 11, and when a scanning signal is applied to a gate of the switching transistor 11 through the scanning lines 5 from the control section 102, the switching transistor 11 is switched on, and the image signal data applied to the drain is transmitted to the capacitor 13 and the driving transistor 12.

The capacitor 13 is charged according to the electric potential of the image data signal transmitted, and the driving transistor 12 is switched on. In the driving transistor 12, the drain is connected to an electric source line 7, and the source to an organic EL element 10. Current is supplied from the electric source line 7 to the organic EL element 10 according to the electric potential of the image data signal applied to the gate.

An organic EL element 10 has plural organic layers and two opposed electrodes between which the organic layers are provided. When current is applied across the plural organic layers through the electrode, light is emitted from a predetermined organic layer according to the amount of the current.

The scanning signal is transmitted to the next scanning line 5 according to the successive scanning of the control section 102, the switching transistor 11 is switched off. Even if the switching transistor 11 is switched off, the driving transistor 12 is turned on since the capacitor 13 maintains a charged potential of image data signal, and light emission from the organic EL element 10 continues until the next scanning signal is applied. When the next scanning signal is applied according the successive scanning, the driving transistor 12 works according to an electric potential of the next image data signal synchronized with the scanning signal, and light is emitted from the organic EL element 10.

That is, light is emitted from the organic EL element 10 in each of the plural pixels 3 due to the switching transistor 11 as an active element and the driving transistor 12 each being provided in the organic EL element 10 of each of the plural pixels 3. This emission process is called an active matrix process.

Herein, light emission from the organic EL element 10 may be emission with plural gradations according to image signal data of multiple value having plural gradation potentials, and emission due to on-off according to a binary value of the image data signals.

The electric potential of the capacitor 13 may maintain till the next application of the scanning signal, or may be discharged immediately before the next scanning signal is applied.

The multicolor light emission apparatus of the invention may emit light employing a passive matrix method as well as the active matrix method as described above. The passive matrix method is one in which light is emitted from the organic EL element 10 according to the data signal only when the scanning signals are scanned.

The organic EL element 10 comprises plural layers of an organic compound, but may comprise a layer (such as a layer of lithium fluoride or an inorganic metal salt, or a layer containing them) other the layers of the organic compound.

The layers of the organic compound comprises at least two layers including a light emission layer having the regions (light emission regions) where light is emitted due to a recombination of holes and electrons injected from a pair of electrodes, and an adjacent layer adjacent to the light emission layer. The light emission regions may occupy the whole of the light emission layer, or a part in the thickness direction of the light emission layer. Further, the light emission regions may be an interface between the light emission layer and the adjacent layer. In the invention, when two layers show the light emission regions, one is a light emission layer and the other is an adjacent layer adjacent to the light emission layer.

The adjacent layer, which will be described later, can be broadly classified into two, that is, a hole transporting layer and an electron transporting layer due to its function. Further, the adjacent layer can be narrowly classified into a hole injecting layer, a hole transporting layer, an electron blocking layer, an electron injecting layer, an electron transporting layer, and a hole blocking layer due to its function.

With respect to the host and dopant contained in the light emission layer, when the light emission layer is comprised of a mixture of two or more kinds of compounds, the compound having a higher content in the mixture is the host and the compound having a lower content in the mixture is the dopant. For example, when the compound A to compound B ratio (by weight) in the light emission layer is 10:90, compound A is a dopant, and the compound B is a host.

Further, when the content ratio, compound A:compound B:compound C in the light emission layer is 5:10:85, compounds A and B are dopants, and compound C is a host.

The content ratio of the dopant is preferably 0.001 to less than 50% by weight, and the content ratio of the host is preferably 50 to less than 100% by weight.

In the invention, that the emission wavelength region of the host is shorter than a blue light wavelength region implies that the maximum emission wavelength (maximum fluorescence wavelength) of the host is not longer than 440 nm. The maximum emission wavelength (maximum fluorescence wavelength) of the host is preferably not longer than 415 nm. This means that when the host is a compound capable of being deposited, the emission spectrum of the deposition layer formed of the host alone is measured, or when the host is a polymer, the emission spectrum of the polymer layer formed of the host alone by a spin coat, casting coat or ink jet method is measured, and the maximum emission (fluorescence) wavelength in the spectrum is not longer than 415 nm.

The maximum fluorescence wavelength is a wavelength giving the maximum fluorescent intensity in the fluorescent spectrum, and is a value specifying a physical property of the materials. When there are plural maximum fluorescence wavelengths, the maximum fluorescence wavelength with the longest wavelength is the maximum fluorescence wavelength. That is, when there are plural energy states providing fluorescence, the maximum fluorescence wavelength represents a wavelength providing the lowest excitation state excited with the lowest energy, and does not relate to fluorescence intensity. When fluorescence intensity is extremely low, the maximum fluorescence wavelength may be in the blue regions, and may be preferably not longer than 415 nm, and is more preferably not longer than 400 nm. The maximum emission wavelength of the host may be not shorter than 200 nm, and is more preferably not shorter than 300 nm.

Those as denoted above in the maximum emission wavelength of the host also apply to a compound with a maximum emission wavelength of not longer than 415 nm in the hole transporting layer and a compound with a maximum emission wavelength of not longer than 415 nm in the electron transporting layer. The maximum emission wavelength of the compound in the hole transporting layer or the maximum emission wavelength of the compound in the electron transporting layer is preferably not longer than 400 nm. The maximum emission wavelength of the compound may be not shorter than 200 nm, and is more preferably not shorter than 300 nm.

Two or more organic EL elements having different maximum emission wavelengths are those in which when electric field is applied to the elements, the difference between the different maximum emission wavelengths emitted is not less than 10 nm. Herein, the maximum emission wavelengths emitted are preferably in the range of from 400 to 700 nm. When three different organic EL elements are arranged in the same base plate, the maximum emission wavelength emitted from the first one is preferably in a range of from 430 to 480 nm (a blue light wavelength region), the maximum emission wavelength emitted from the second one is preferably in a range of from 500 to 570 nm (a green light wavelength region), and the maximum emission wavelength emitted from the third one is preferably in a range of from 570 to 680 nm (a red light wavelength region).

In the invention, preferred examples of a set of electrodes or a layer constitution of an organic compound layer will be shown below, but the present invention is not limited thereto.

(i) Anode/Hole transporting layer/Electron transporting light emission layer/Cathode
(ii) Anode/Hole transporting layer/Electron transporting light emission layer/Electron transporting layer/Cathode
(iii) Anode/Hole injecting layer/Hole transporting layer/Electron transporting light emission layer/Cathode
(iv) Anode/Hole transporting light emission layer/Electron transporting layer/Cathode
(v) Anode/Hole transporting layer/Hole transporting light emission layer/Electron transporting layer/Cathode
(vi) Anode/Hole injecting layer/Hole transporting layer/Hole transporting light emission layer/Electron transporting layer/Cathode
(vii) Anode/Hole transporting layer/Electron transporting light emission layer/Electron transporting layer/Cathode
(viii) Anode/Hole transporting light emission layer/Electron transporting layer/Electron injecting layer/Cathode
(ix) Anode/Hole injecting layer/Hole transporting light emission layer/Hole blocking layer/Electron transporting layer/Electron injecting layer/Cathode In the above, the hole transporting light emission layer or electron transporting light emission layer is the light emission layer in the invention, and a layer adjacent to the light emission layer are an adjacent layer.

For the anode of the organic EL element, a metal, an alloy, or an electroconductive compound each having a high working function (not less than 4 eV), and mixture thereof are preferably used as the electrode material. Concrete examples of such an electrode material include a metal such as Au, and a transparent electroconductive material such as CuI, indium tin oxide (ITO), $SnO_2$, or ZnO, and a material capable of forming an amorphous and transparent conductive layer such as IDIXO ($In_2O_3$—ZnO). The anode may be prepared by forming a thin layer of the electrode material according to a depositing or spattering method, and by forming the layer into a desired pattern according to a photolithographic method. When required precision of the pattern is not so high (not less than 100 μm), the pattern may be formed by depositing or spattering of the electrode material through a mask having a desired form. When light is emitted through the anode, the transmittance of the anode is preferably 10% or more, and the sheet resistance of the anode is preferably not more than several hundred $\Omega/\square$. The thickness of the layer is ordinarily within the range of from 10 nm to 1 μm, and preferably from 10 to 200 nm, although it may vary due to kinds of materials used.

On the other hand, for the cathode, a metal (also referred to as an electron injecting metal), an alloy, and an electroconductive compound each having a low working function (not more than 4 eV), and a mixture thereof is used as the electrode material. Concrete examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture or aluminum, is suitable from the view point of the electron injecting ability and resistance to oxidation. The cathode can be prepared forming a thin layer of such an electrode material by a method such as a deposition or spattering method. The sheet resistance as the cathode is preferably not more than several hundred $\Omega/\square$, and the thickness of the layer is ordinarily from 10 nm to 1 μm, and preferably from 50 to 200 nm. It is preferable in increasing the light emission efficiency that either the anode or the cathode of the organic EL element is transparent or semi-transparent.

Next, the light emission layer, and the injecting layer, hole transporting layer, or electron transporting layer as the adjacent layer in the invention will be explained.

The injecting layer is optionally provided, for example, an electron injecting layer or a hole injecting layer, and may be provided between the anode and the light emission layer or hole transporting layer, and between the cathode and the light emission layer or electron transporting layer as described above.

The injecting layer herein referred to is a layer provided between the electrode and an organic layer in order to reduce the driving voltage or to improve of light emission efficiency. As the buffer layer there are a hole injecting layer (an anode buffer layer) and an electron injecting layer (a cathode buffer layer), which are described in "Electrode Material" page 123, Div. 2 Chapter 2 of "Organic EL element and its frontier of industrialization" (published by NTS Corporation, Nov. 30, 1998) in detail.

The anode buffer layer (hole injecting layer) is described in Japanese Patent O.P.I. Publication Nos. 9-45479, 9-260062, and 8-288069 etc., and its examples include a phthalocyanine buffer layer represented by a copper phthalocyanine layer, an oxide buffer layer represented by a vanadium oxide layer, an amorphous carbon buffer layer, a polymer buffer layer employing an electroconductive polymer such as polyaniline (emeraldine), and polythiophene, etc.

The cathode buffer layer (electron injecting layer) is described in Japanese Patent O.P.I. Publication Nos. 6-325871, 9-17574, and 9-74586, etc. in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide.

The buffer layer (injecting layer) is preferably very thin and has a thickness of preferably from 0.1 to 100 nm depending on kinds of the material used.

The blocking layer is a layer provided if necessary in addition to the fundamental configuration layers as described above, and is for example a hole blocking layer as described in Japanese Patent O.P.I. Publication Nos. 11-204258, and 11-204359, and on page 237 of "Organic EL element and its frontier of industrialization" (published by NTS Corporation, Nov. 30, 1998).

The hole blocking layer is an electron transporting layer in a broad sense, and is comprised of material having an ability of transporting electrons but an extremely poor ability of holes, which can increase a recombination probability of electrons and holes by transporting electrons and blocking holes.

On the other hand, the electron blocking layer is an hole transporting layer in a broad sense, and is comprised of material having an ability of transporting holes but an extremely poor ability of electrons, which can increase a recombination probability of electrons and holes by transporting holes and blocking electrons.

The hole transporting layer is comprised of material having an ability of transporting holes, and a hole injecting layer and an electron blocking layer are included in the hole transporting layer in a broad sense.

The hole transporting layer or electron transporting layer may be a single layer or plural layers.

In the organic EL element in the invention, the host compound used in the light emission layer, a hole transporting compound, or an electron transporting compound is not specifically limited, but the host compound in the light emission layer, compound in the hole transporting layer adjacent to the light emission layer and compound in the electron transporting layer adjacent to the light emission layer have a maximum emission (fluorescence) wavelength of preferably not longer than 415 nm. All the compounds described above have a maximum emission wavelength of more preferably not longer than 400 nm.

When a multicolor light emission apparatus comprising plural organic EL elements such as BGR having different light emission wavelengths is designed, kinds of the host compound, dopant compound, hole transporting compound and electron transporting compound or the content thereof is selected and employed in each organic EL element, separately so as to control hole transportability or electron transportability in order to overcome the color fluctuation resulting from the energy relationship described above, and otherwise, optimum light cannot be obtained. That is, each organic EL element needs to have different compounds, has a different optimum content of the compounds, and a different layer thickness, and therefore, the degree of freedom of the EL element design is low and demerit in manufacture cost is great.

The preset invention has been attained employing, as the host, compound having a maximum emission (fluorescence) wavelength in the wavelength regions shorter than the blue wavelength regions, and preferably a maximum emission (fluorescence) wavelength not longer than 415 nm, and employing the same host in the plural organic EL elements. Further, use of compounds having a maximum emission (fluorescence) wavelength not longer than 415 nm as the hole transporting compound or the electron transporting compound has made it possible to employ the same compound in the hole transporting layer or the electron transporting layer of each of the plural organic EL elements. Employing the same compound in the hole transporting layer or the electron transporting layer of each of the plural organic EL elements means that a multicolor light emission apparatus can be manufactured simultaneously forming the same layers as the common layer, regardless of the kinds of the organic EL elements.

Next, a dopant will be explained.

The dopant is divided in two types in principle, one is an energy transfer type in which recombination of a carrier occurs on the host to which the carrier is transported to excite the host, the resulting energy is transferred to the dopant, and light is emitted from the dopant, and the other is a carrier trap type in which recombination of a carrier occurs on the dopant, a carrier trap material, and light is emitted from the dopant. However, in each type of the dopant, energy level of the dopant in excited state is lower than that of the host in excited state.

In the energy transfer type, as condition easily transferring energy, the overlapping integral between emission of the host and absorption of the dopant is greater. In the carrier trap type, it is necessary to have an energy relationship in which a carrier is easily trapped. For example, when an electron carrier is trapped, it is necessary that electron affinity (LUMO level) of the dopant be higher than that (LUMO level) of the host. On the contrary, when a hole carrier is trapped, it is necessary that ionization potential (HOMO level) of the dopant be lower than that (HOMO level) of the dopant.

In view of the above, the dopant compound as a dopant can be selected based on emission efficiency and emission color including color purity, and the host compound can be selected from compounds which have a good carrier transporting property and satisfy the relationship as described above.

The dopant in the light emission layer can be used selecting from known ones used as the dopant of the EL element, but is preferably an organic compound or a complex each emitting fluorescence or phosphorescence.

A fluorescent dopant is preferably a compound with high fluorescent quantum yield represented by a laser dye. A phosphorescent dopant is preferably a compound capable of emitting phosphorescence at room temperature, for example, an iridium complex, a platinum complex or a europium complex, but is not limited thereto.

Examples of the dopant compound will be listed below, but are not limited thereto.

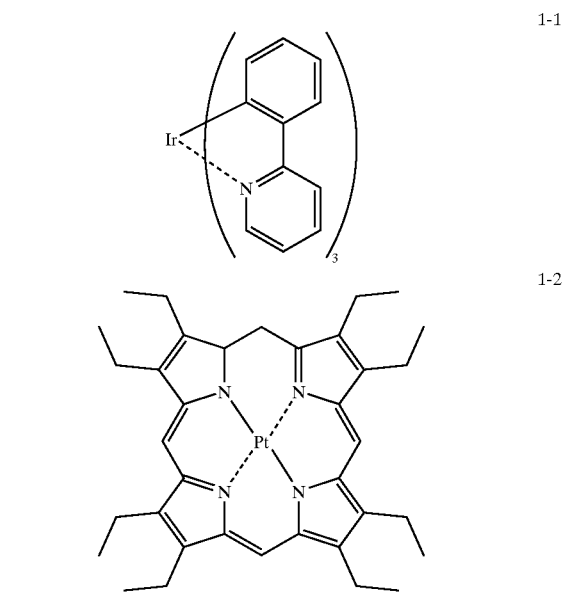

1-3

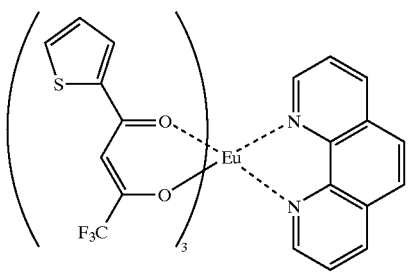

The host compound in the light emission layer is preferably an organic compound or a complex, and the host in the invention has a maximum emission (fluorescence) wavelength of preferably not longer than 415 nm. By adjusting the maximum emission wavelength of the host to not longer than 415 nm, a visible light can be emitted, and particularly, BGR lights can be emitted.

The ordinary π conjugated fluorescent or phosphorescent compound, in which the maximum emission wavelength is adjusted to not longer than 415 nm, has a π—π absorption in the wavelength regions of not longer than 420 nm, and can carry out a dopant emission of energy transfer type. The fluorescence of not longer than 415 nm provides a wide energy gap (ionization potential-electron affinity, HOMO-LUMO), and advantageously works in the carrier trap type.

Such a host compound can be used optionally selecting from known materials used in the organic EL element, and most of the hole transporting compounds or electron transporting compounds as described above can be used as the host of the light emission layer.

A polymer such as polyvinyl carbazol or polyfluorenone can be used, and a polymer in which the host compound mentioned above is introduced in the polymer chain or a polymer having the host compound as the polymer main chain can be also used.

The host compound is preferably a compound with high Tg (glass transition temperature), which has a hole and electron transporting ability, and prevents the emission wavelength shifting to longer wavelength.

Such an organic compound can be prepared for example by arranging the π electron planes of the chemical structure in different planes according to effect of steric hindrance. For example, there is mentioned of a method in which introducing a substituent causing steric hindrance in the ortho position (to a nitrogen atom) of aryl groups in triarylamine, whereby a twisted angle formed between the aryl groups is increased. That is, an emission compound with high Tg, which can emit light with a shorter wavelength, can be obtained without lowering the Tg by introducing a steric hindrance providing substituent such as a methyl group, a t-butyl group, an isopropyl group, or a naphthyl group (a hydrogen atom at a peri-position) in the organic compound, although a hole or electron transporting ability is slightly lowered. The substituents are not limited to the above.

The compound can be also obtained by introducing a conjugated group in the non-conjugated position of an aromatic ring (for example, the meta position of the phenyl group in triphenylamine).

Examples of the emission compound having a substituent with a steric hindrance-providing group or the compound with the non-conjugated bond will be listed below, but are not limited thereto.

2-1

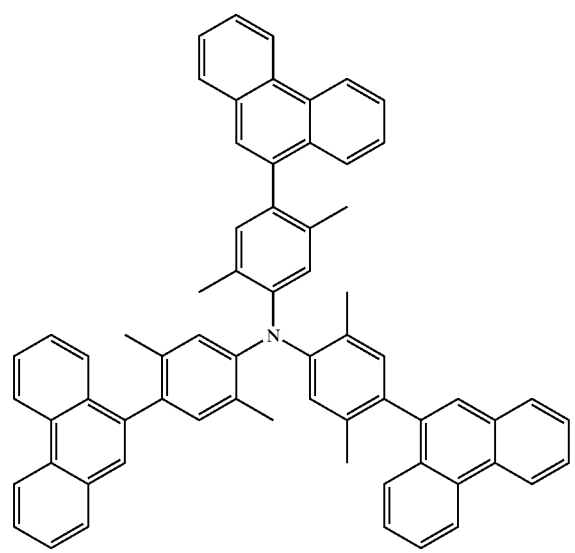

2-2

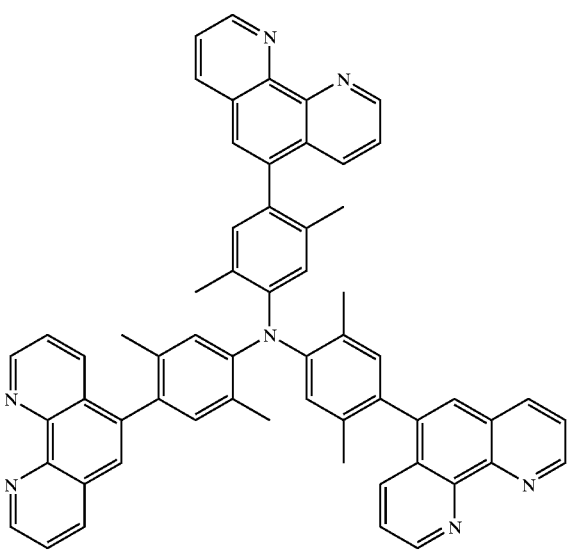

-continued
2-3
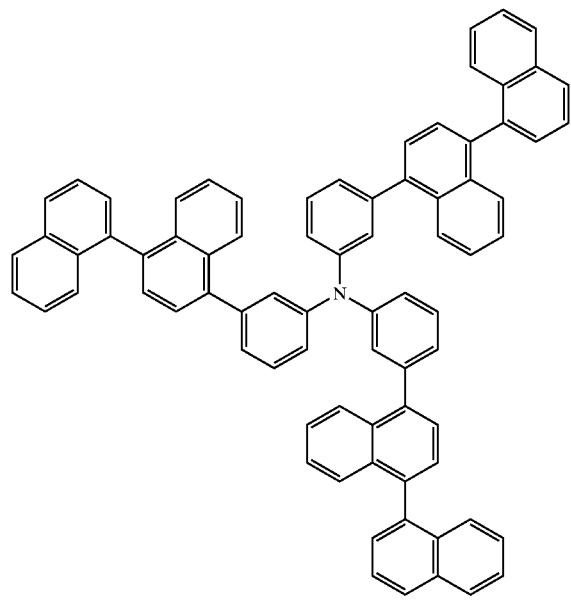
2-4
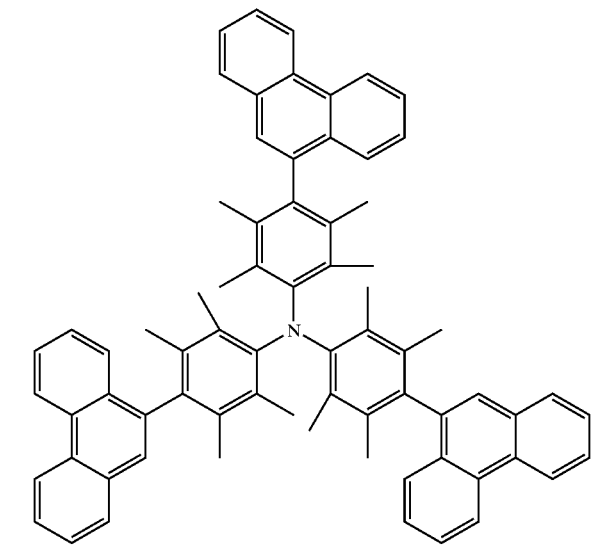
2-5
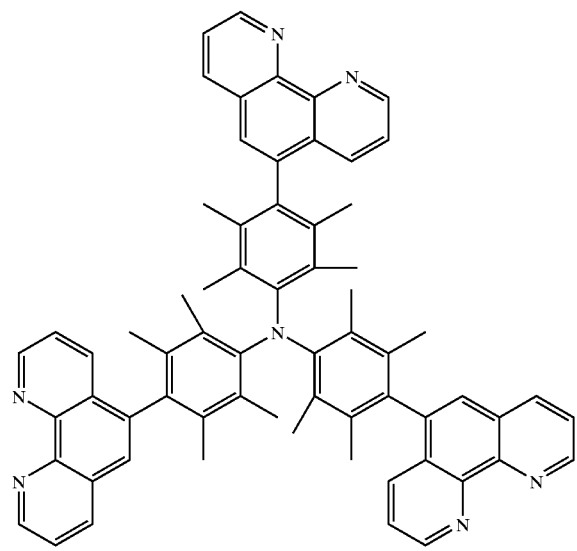
2-6
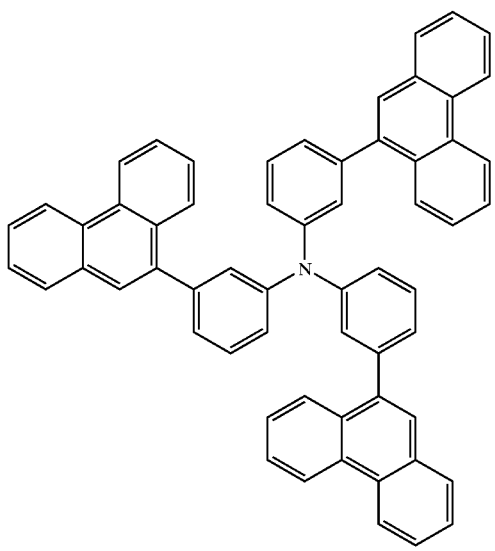
2-7
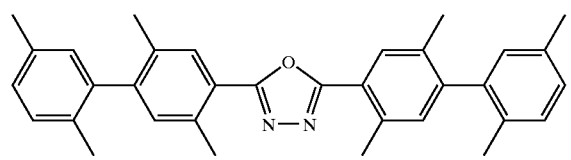
2-8
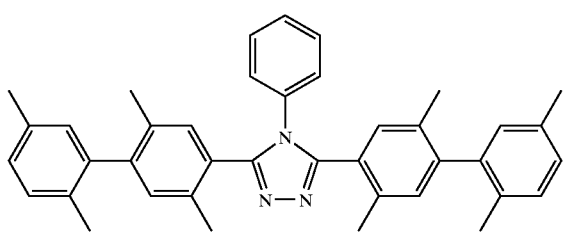

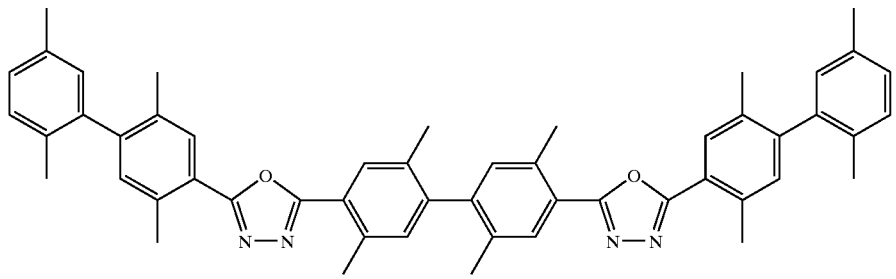

2-9

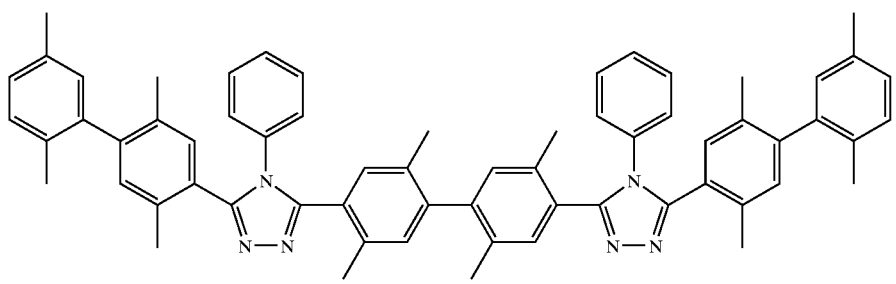

2-10

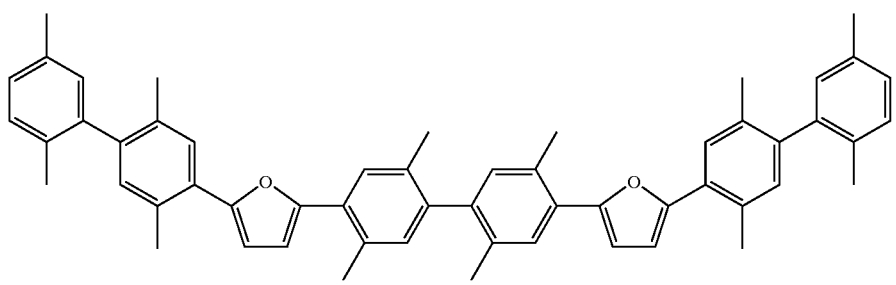

2-11

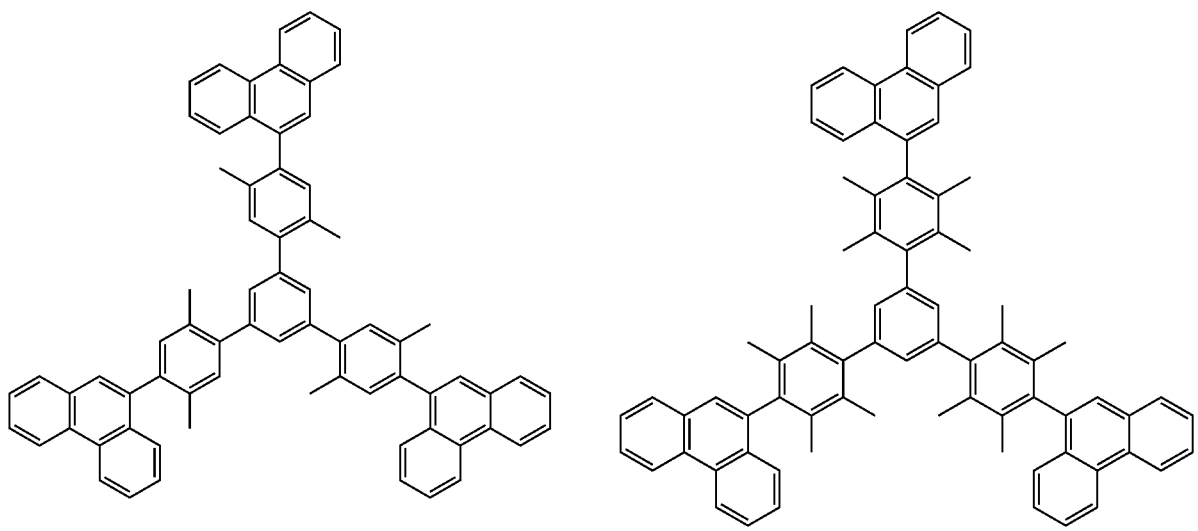

2-12    2-13

The hole transporting layer comprises a compound having a hole transporting ability, and in a broad sense refers to a hole injecting layer or an electron blocking layer. The hole transporting layer can be provided as a single layer or plural layers.

The hole transporting compounds are not specifically limited, and can be optionally selected from those employed for hole transporting compounds in conventional photoconductive elements or known materials used in the hole injecting layer or hole transporting layer of conventional EL elements.

The hole transporting compound described above may be either an organic substance or an inorganic substance as long as it has a hole injecting ability, a hole transporting ability or an ability to form a barrier to electrons. Examples of the hole injecting compound or the hole transporting compound include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, particularly a thiophene oligomer. As the hole transporting material, those described above are used, but a porphyrin compound, an aromatic tertiary amine compound, or a styrylamine compound is preferably used, and an aromatic tertiary amine compound is more preferably used.

Typical examples of the aromatic tertiary amine compound and styrylamine compound include N,N,N', N'-tetraphenyl-4,4'-diaminophenyl, N,N'-diphenyl-N,N'-bis(3-methylphenyl)-[1,1'-biphenyl]-4,4'-diamine (TPD), 2,2'-bis(4-di-p-tolylaminophenyl)propane, 1,1'-bis(4-di-p-tolylaminophenyl)cyclohexane, N,N,N',N'-tetra-p-tolyl-4,4'-diaminobiphenyl, 1,1'-bis(4-di-p-tolylaminophenyl)-4-phenylcyclohexane, bis(4-dimethylamino-2-methylphenyl)-phenylmethane, bis(4-di-p-tolylaminophenyl)-phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4', 4"-tris[N-(3-methylphenyl)-N-phenylamino]-triphenylamine (MTDATA) in which three triphenylamine units are bonded in a starburst form.

A polymer in which the compound mentioned above is introduced in the polymer chain or a polymer having the material as the polymer main chain can be also used.

As the hole injecting material or the hole transporting compound, inorganic compounds such as p-Si and p-SiC are usable.

In the invention, the hole transporting compound contained in the hole transporting layer adjacent to the light emission layer is preferably a compound having a maximum fluorescence wavelength of not longer than 415 nm.

That is, the hole transporting compound contained in the hole transporting layer adjacent to the light emission layer is preferably a compound with high Tg, which has a hole and electron transporting ability, and prevents the emission wavelength shifting to longer wavelength.

Such an organic compound can be prepared for example by arranging the π electron planes of the chemical structure in different planes according to effect of steric hindrance. For example, there is mentioned of a method in which introducing a substituent causing steric hindrance in the ortho position (to a nitrogen atom) of aryl groups in triarylamine, whereby a twisted angle formed between the aryl groups is increased. That is, a hole transporting compound with high Tg, which can emit light with a shorter wavelength, can be obtained without lowering the Tg by introducing a steric hindrance providing substituent such as a methyl group, a t-butyl group, an isopropyl group, or a naphthyl group (a hydrogen atom at a peri-position) in the organic compound, although a hole transporting ability is slightly lowered. The substituents are not limited to the above.

The compound can be also obtained by introducing a conjugated group in the non-conjugated position of an aromatic ring (for example, the meta position of the phenyl group in triphenylamine).

Examples of the hole transporting material having a substituent with a steric hindrance-providing group or the hole transporting material with the non-conjugated bond will be listed below, but are not limited thereto.

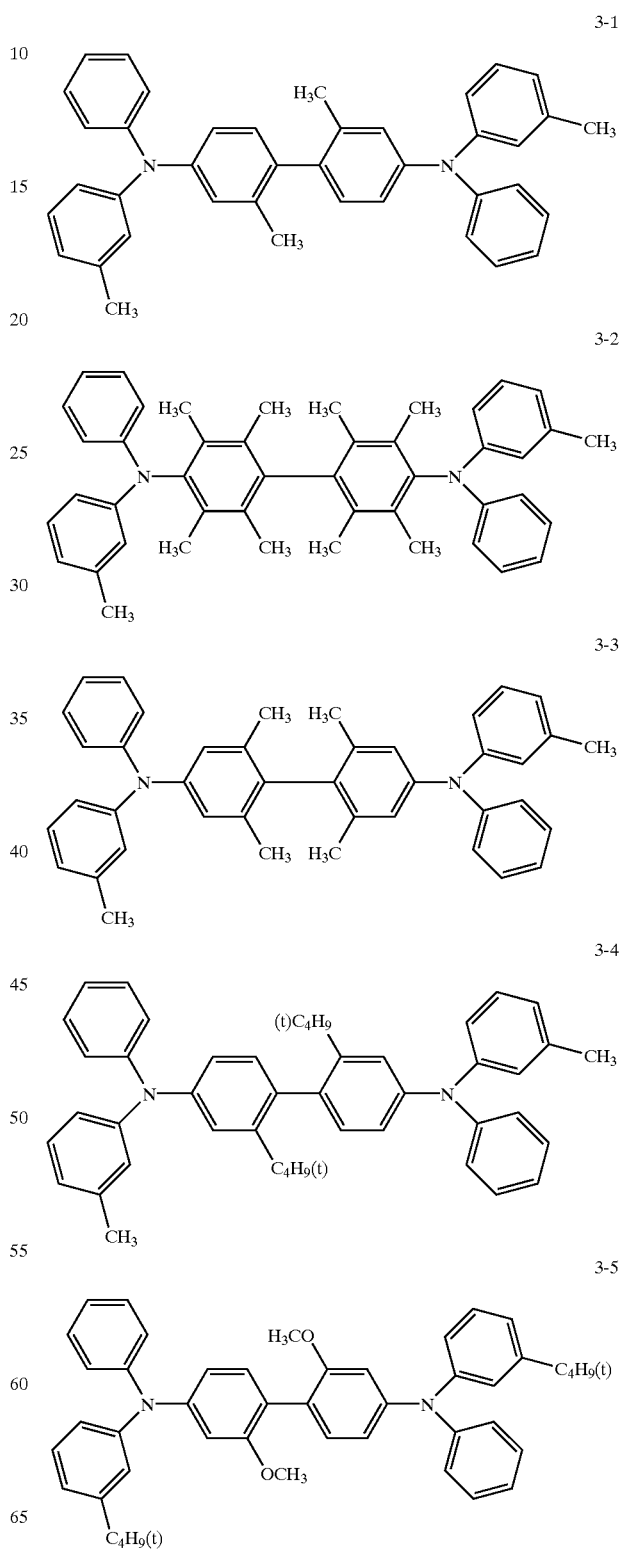

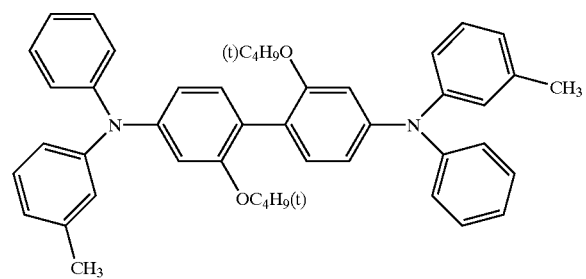
3-6
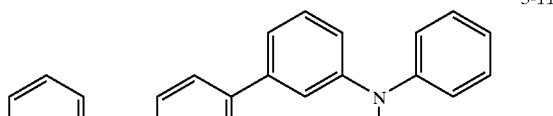
3-11
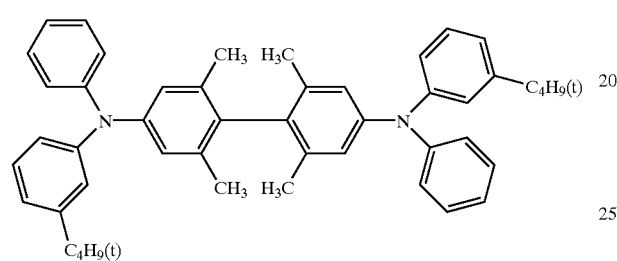
3-7
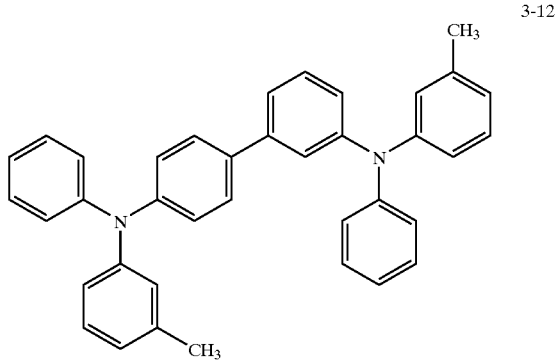
3-12
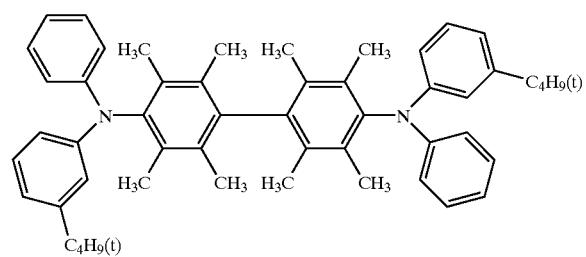
3-8
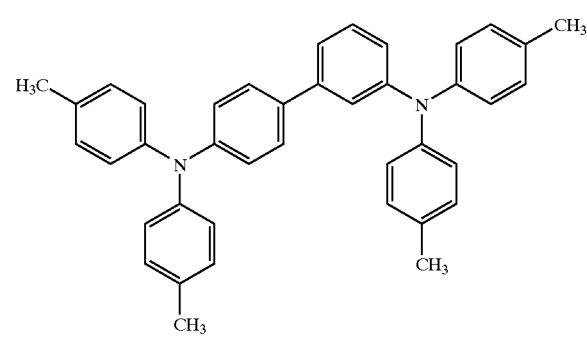
3-13
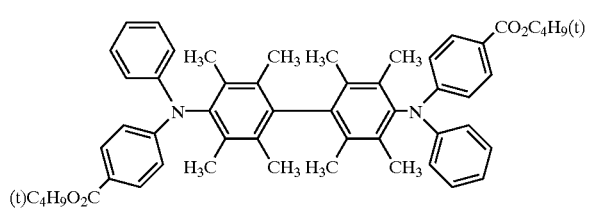
3-9
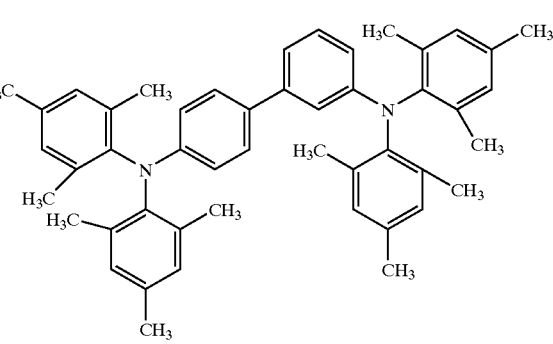
3-14
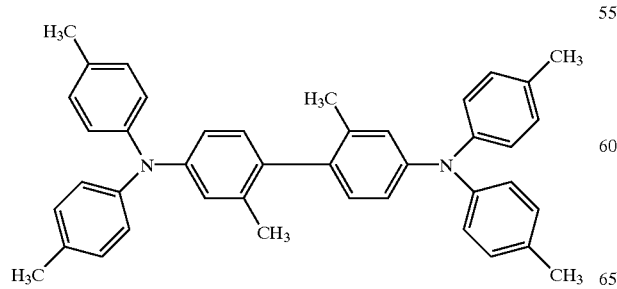
3-10
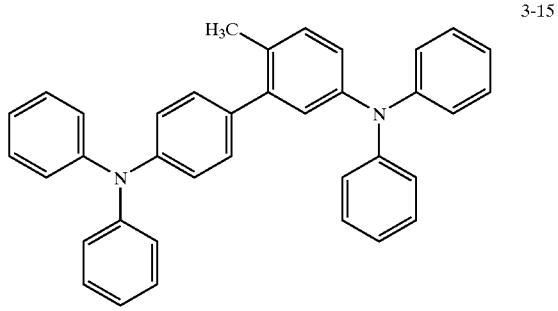
3-15

-continued
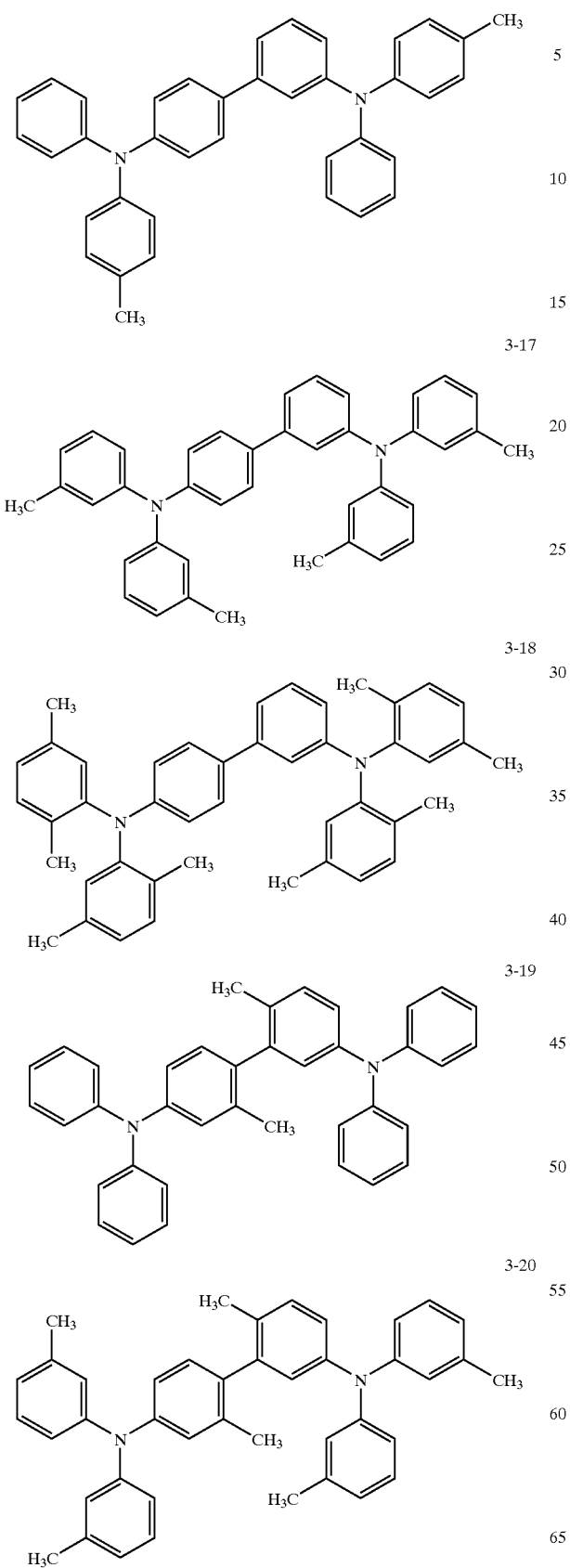
3-16
3-17
3-18
3-19
3-20
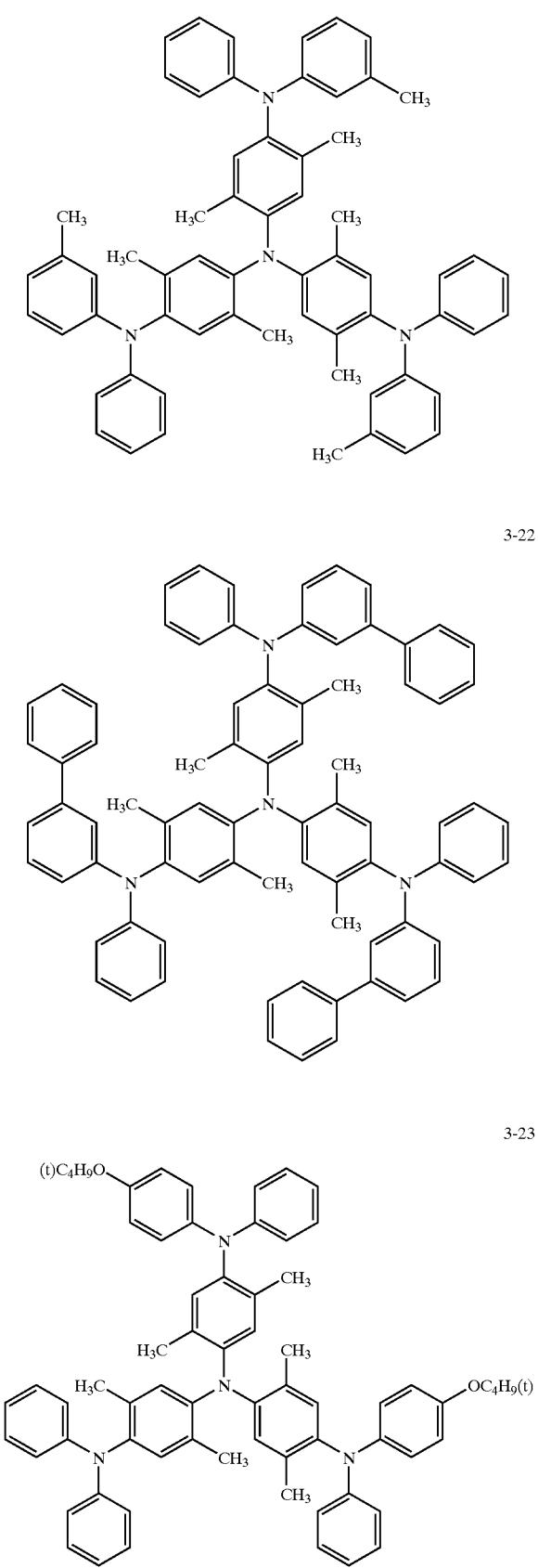
3-21
3-22
3-23

-continued
3-24
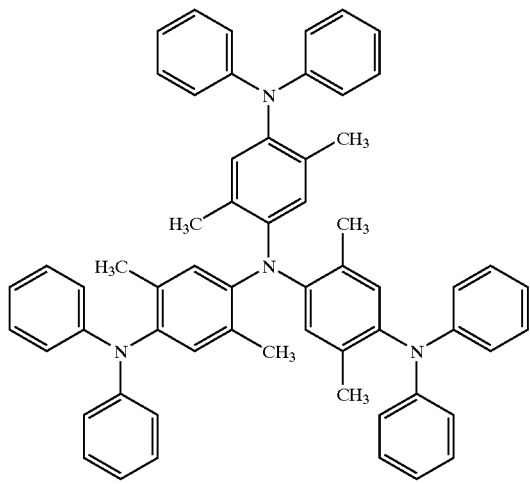
3-25
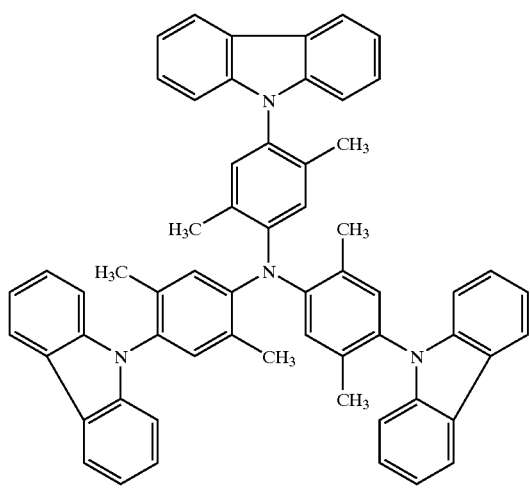
3-26
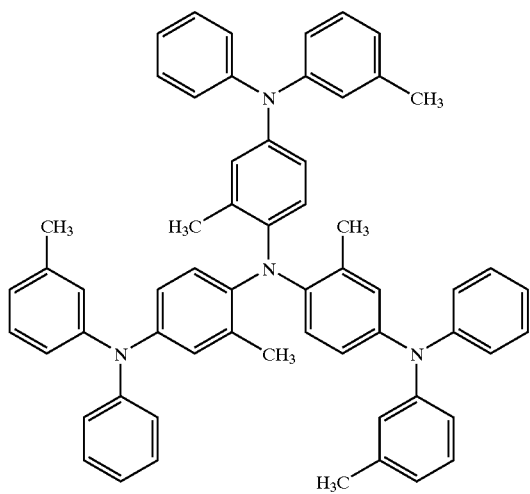
-continued
3-27
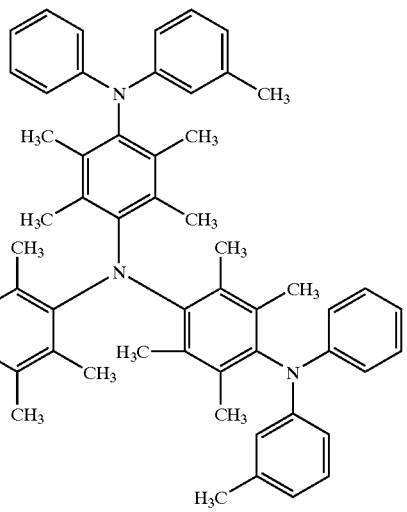
3-28
3-29
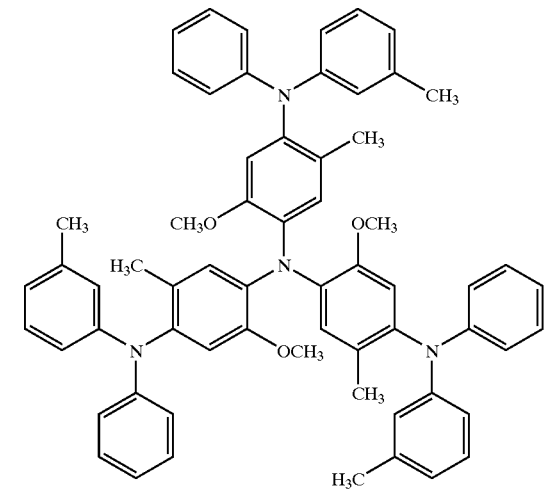

-continued 3-30

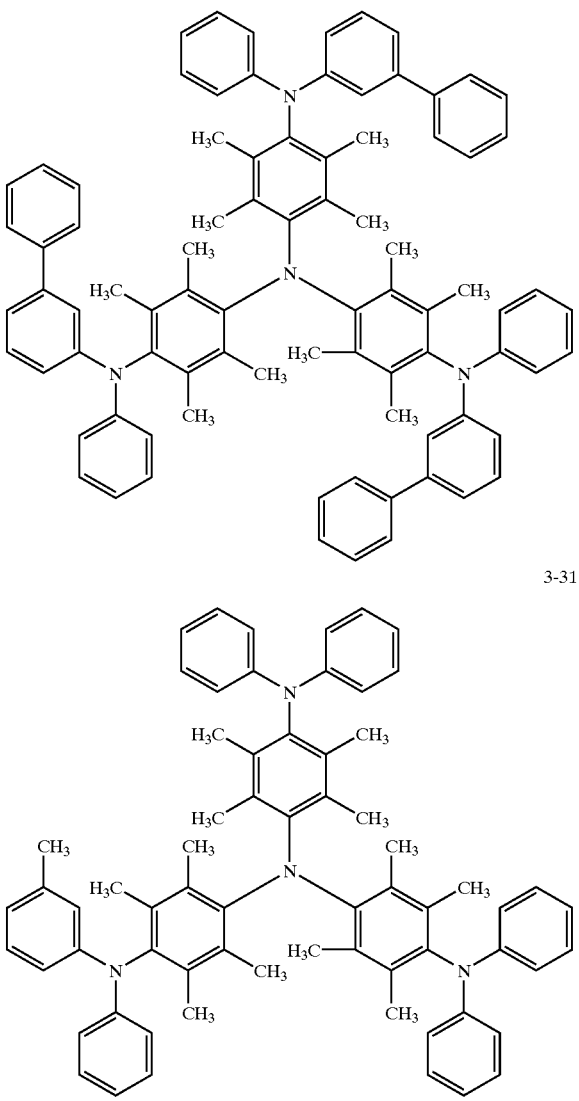

3-31

The hole transporting layer can be formed by layering the hole transporting compound by a known method such as a vacuum deposition method, a spin coat method, a casting method, an ink jet method, and an LB method. The thickness of the hole transporting layer is not specifically limited, but is ordinarily from 5 nm to 5 μm. The hole transporting layer may be composed of a single layer structure comprising one or two or more of the compounds mentioned above.

The electron transporting layer comprises a compound having an electron transporting ability, and in a broad sense refers to an electron injecting layer or a hole blocking layer. The electron transporting layer can be provided as a single layer or plural layers.

The electron transporting compounds are not specifically limited, and can be optionally selected from known compounds used as the hole transporting compounds of conventional EL elements.

Examples of the electron transporting compound include a phenanthroline derivative, a bipyridine derivative, a nitro-substituted fluorene derivative, a diphenylquinone derivative, a thiopyran dioxide derivative, a heterocyclic tetracarboxylic acid anhydride such as naphthaleneperylene, a carbodiimide, a fluolenylidenemethane derivative, an anthraquinodimethane an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting compound or electron injecting compound.

A polymer in which the compound mentioned above is introduced in the polymer chain or a polymer having the compound as the polymer main chain can be also used.

A metal complex can be also used. In the invention, the electron transporting compound contained in the electron transporting layer adjacent to the light emission layer is preferably a compound having a maximum fluorescence wavelength of not longer than 415 nm. That is, the electron transporting compound contained in the electron transporting layer adjacent to the light emission layer is preferably a compound with high Tg, which has an electron transporting ability, and prevents the emission wavelength shifting to longer wavelength.

Such an organic compound can be prepared for example by arranging the π electron planes of the chemical structure in different planes according to effect of steric hindrance. For example, there is mentioned of a method in which introducing a substituent causing steric hindrance in the ortho position (to a nitrogen atom) of aryl groups in triarylamine, whereby a twisted angle formed between the aryl groups is increased. That is, an electron transporting compound with high Tg, which can emit light with a shorter wavelength, can be obtained without lowering the Tg by introducing a steric hindrance providing substituent such as a methyl group, a t-butyl group, an isopropyl group, or a naphthyl group (a hydrogen atom at a peri-position) in the organic compound, although an electron transporting ability is slightly lowered. The substituents are not limited to the above.

The organic compound can be also obtained by introducing a conjugated group in the non-conjugated position of an aromatic ring (for example, the meta position of the phenyl group in triphenylamine).

Examples of the electron transporting material having a substituent with a steric hindrance-providing group or the electron transporting compound with the non-conjugated bond include compounds 2-7 through 2-11 (4-1 through 4-5), 2-12 (4-6), and 2-13 (4-10), and will be listed below, but are not limited thereto.

4-6

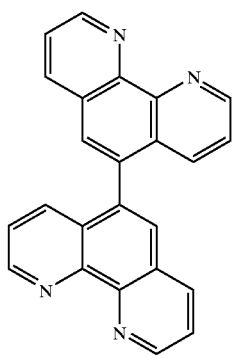

4-7

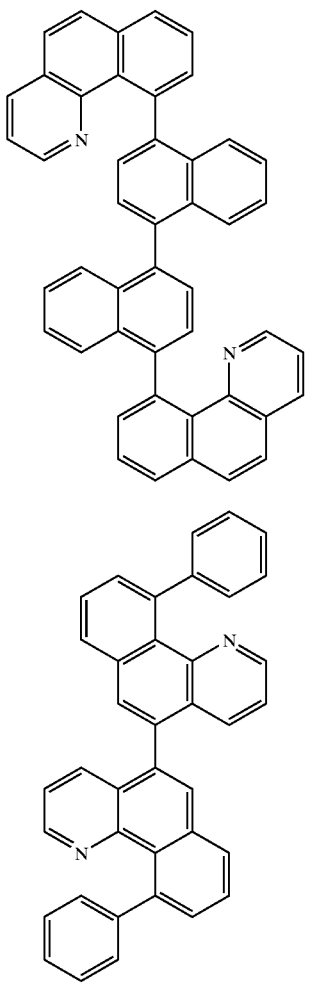

4-8

The electron transporting layer can be formed by layering the above compound by a known method such as a vacuum deposition method, a spin coat method, a casting method, an ink jet method, and an LB method. The thickness of the electron transporting layer or electron injecting layer is not specifically limited, but is ordinarily from 0.1 nm to 5 µm. The electron transporting layer or electron injecting layer may be composed of a single layer structure comprising one or two or more of the electron transporting compound mentioned above.

It is preferred that each of all the components constituting the organic compound layer in the organic EL element in the invention has a Tg of not less than 100° C., which increases the lifetime of the EL element, and provides flexibility to the EL element itself. The Tg is measured through a differential scanning calory measuring method (DSC).

A substrate preferably employed for the organic electroluminescent element in the invention is not restricted to specific kinds of materials such as glass and plastic, as far as it is transparent. Examples of the substrate preferably used include glass, quartz and light transmissible plastic film. Especially preferred one is a resin film capable of providing flexibility to the organic EL element.

Examples of the resin film include films of polyethyleneterephthalate (PET), polyethylenenaphthalate (PEN), polyethersulfone (PES), polyetherimide, polyetheretherketone, polyphenylenesulfide, polyarylate, polyimide, polycarbonate (PC), cellulose triacetate (TAC), cellulose acetate propionate (CAP) and so on.

The surface of the resin film may have a layer of an inorganic or organic compound or a hybrid layer of both compounds.

The external light emission efficiency of the organic electroluminescence element in the invention is preferably not less than 1%, and more preferably not less than 2% at room temperature. Herein, external quantum yield (%) is represented by the following formula:

External quantum yield (%)=(the number of photons emitted to the exterior of the organic electroluminescence element×100)/ (the number of electrons supplied to the organic electroluminescence element)

A hue improving filter such as a color filter may be used in combination. The multicolor light emission apparatus of the invention comprises at least two organic EL elements each having a different maximum emission wavelength. Preferable examples in the preparation of the organic EL element will be described below.

For one example, the preparation of the EL element having the constitution, Anode/Hole injecting layer/Hole transporting layer/Hole transporting light emission layer/ Electron transporting layer/Electron injecting layer/cathode, will be described. A thin layer of a desired material for electrode such as a material of the anode is formed on a suitable substrate by a deposition or spattering method so that the thickness of the layer is not more than 1 µm, and preferably within the range of from 10 to 200 nm to prepare the anode. Then the hole injecting layer, the hole transporting layer, the hole transporting light emission layer, the electron transporting layer and the electron injecting layer, which constitute the element, are formed on the resulting anode in that order as an organic compound thin layer.

As described above, there is a spin coating method, a casting method, an ink jet method, a deposition method, and a printing method for formation of the thin layer, however, a spin coating method and a vacuum deposition method is preferably used, since a uniform layer can be formed and a pinhole is formed with difficulty. Different methods may be used for different layer formation. Although conditions of the vacuum deposition are different due to kinds of materials used, the vacuum deposition is preferably carried out at a boat temperature of from 50° C. to 450° C., at a vacuum degree of from $10^{-6}$ to $10^{-2}$ Pa, at a deposition speed of from 0.01 to 50 nm/second, and at a substrate temperature of from −50 to 300° C., to form a layer thickness of from 0.1 nm to 5 µm.

After formation of these layers, a thin layer comprising a material for cathode is formed thereon by, for example, a deposition method or spattering method so that the thickness is not more than 1 µm, and preferably from 50 to 200 nm, to provide the cathode. Thus a desired EL element is obtained. It is preferred that the layers from the hole injecting layer to the cathode are continuously formed under one time of vacuuming to prepare the organic EL element. However, on the way of the layer formation under vacuum a different layer formation method may be inserted. When the different method is used, its process is required to be carried out under a dry inert gas atmosphere.

The multicolor light emission apparatus of the invention can be most easily manufactured according to the method of claim 15, wherein a shadow mask is used only in the light emission layer formation. In this method, other layers than the light emission layer are common, and can be formed employing a vacuum method, a casting method, a spin coat method or a printing method in which patterning employing the shadow mask is not required.

When patterning is used only in the light emission layer formation, the layer formation method is carried out according to preferably a deposition method, an ink jet method or a printing method, although not specifically limited. When a deposition method is used as the layer formation method, the patterning is preferably carried out employing a shadow mask.

Further, the organic EL element can be prepared in the reverse order, in which the cathode, the electron injecting layer, the electron transporting layer, the hole transporting light emission layer, the hole transporting layer, the hole injecting layer, and the anode are formed in that order.

The manufacturing method of the multicolor emission apparatus in the invention will be detailed in the examples described later.

In the thus obtained multicolor emission apparatus in which a direct current voltage is applied, when a voltage of 2 to 40 V is applied setting the anode as a + polarity and the cathode as a − polarity, light emission occurs. When voltage is applied with the reverse polarity, no current flows, and light is not emitted at all. When an alternating voltage is applied, light emission occurs only at the time when the polarity of the anode is "+" and that of the cathode is "−". The wave shape of the alternating current may be any one.

The multicolor light emission apparatus of the invention can be used as a display device, a display, or various light emission sources. The display device or the display can present a full color image, which employs three kinds of organic EL elements, an element emitting a blue light, an element emitting a red light, and an element emitting a green light.

Examples of the display device or the display include a television, a personal computer, a mobile device or an AV device, a display for text broadcasting, and an information display used in a car. The multicolor emission apparatus may be used as particularly a display for reproducing a still image or a moving image. When the apparatus is used as a display for reproducing a moving image, the driving method may be either a simple matrix (passive matrix) method or an active matrix method.

Examples of the light emission sources include a home lamp, a room lamp in a car, a backlight for a watch or a liquid crystal, a light source for boarding advertisement, a signal device, a light source for a photo memory medium, a light source for an electrophotographic copier, a light source for an optical communication instrument, and a light source for an optical sensor, but are not limited thereto.

The organic EL element in the invention may be an organic EL element having a resonator structure.

The organic EL element having a resonator structure is applied to a light source for a photo-memory medium, a light source for an electrophotographic copier, a light source for an optical communication instrument, or a light source for a photo-sensor, but its application is not limited thereto.

In the above application, a laser oscillation may be carried out.

EXAMPLES

The present invention will be explained in the following examples, but is not limited thereto.

Example 1

Figure 4:
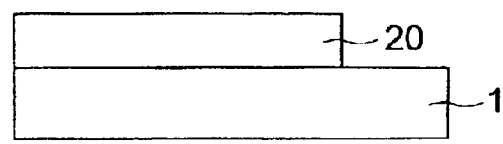
FIG. 4 is a schematic drawing of a glass substrate and an anode provided thereon.

As shown in FIG. 4, an ITO layer with a thickness of 200 nm was deposited on a glass substrate 1 to form an anode 20 (a sheet resistance of 30 Ω/□). Compound 3-21 was deposited on the anode 20 employing a vacuum deposition method to obtain a hole transporting layer 21 with a thickness of 33 nm. Subsequently, a shadow mask shown in FIG. 5 was placed on the resulting layer, and compound 2-1 and tetraphenylbutadiene (TPB) (compound 2-1:TPB=95:5) were co-deposited through the shadow mask to obtain a blue light emission layer 22 with a thickness of 33 nm.

After that, the shadow mask was laterally shifted, and compound 2-1 and compound cumarin 6 (compound 2-1:cumarin 6=97:3) were co-deposited through the shadow mask to obtain a green light emission layer 23 with a thickness of 33 nm. After that, the shadow mask was further laterally shifted, and compound 2-1 and compound DCM II (compound 2-1:DCM II=97:3) were co-deposited through the shadow mask to obtain a red light emission layer 24 with a thickness of 33 nm.

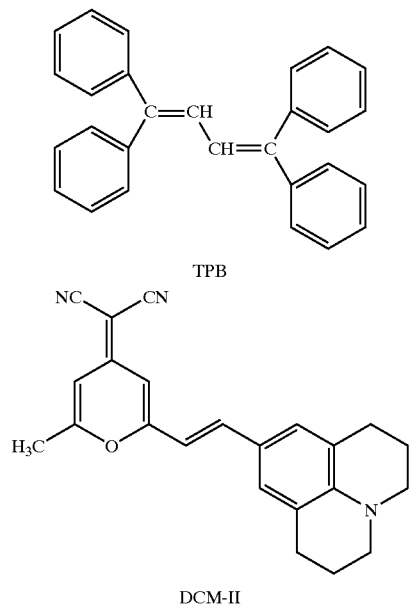

TPB

DCM-II

Then, the shadow mask was removed, and compound BC (described below) was deposited on the entire surface of the resulting layer to obtain an electron transporting layer 25 with a thickness of 33 nm.

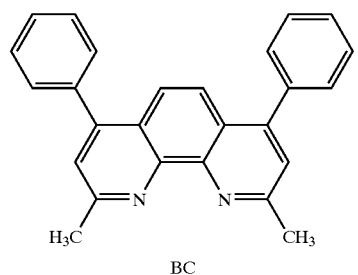

BC

Next, LiF was deposited on the entire surface of the resulting electron transporting layer to obtain an electron injecting layer 26 with a thickness of 0.5 nm. Finally, a shadow mask shown in FIG. 6 was placed on the resulting electron injecting layer 26, and Al was deposited through the shadow mask to obtain a cathode 27 with a thickness of 200 nm. Thus, a multicolor light emission apparatus sample No. 1, as shown in FIG. 7, was prepared.

The maximum fluorescence wavelength of compound 3-21 (hole transporting layer) was 393 nm, that of compound 2-1 (host compound in the light emission layer) 398 nm, and that of BC (electron transporting layer) 398 nm, each being measured as a layer. Regarding the emission properties of the multicolor light emission apparatus sample prepared above, the maximum emission wavelength of the blue light emission element was 440 nm, that of the green light emission element was 510 nm, and that of the red light emission element was 580 nm.

Example 2

An ITO layer with a thickness of 200 nm was deposited on a glass substrate 1 to form an anode 20 (a sheet resistance of 30 Ω/□). Compound m-MTDATA was deposited on the anode 20 employing a vacuum deposition method to obtain a hole injecting layer 28 with a thickness of 30 nm. Subsequently, compound 3-21 was deposited on the resulting layer employing a vacuum deposition method to obtain a hole transporting layer 21 with a thickness of 30 nm.

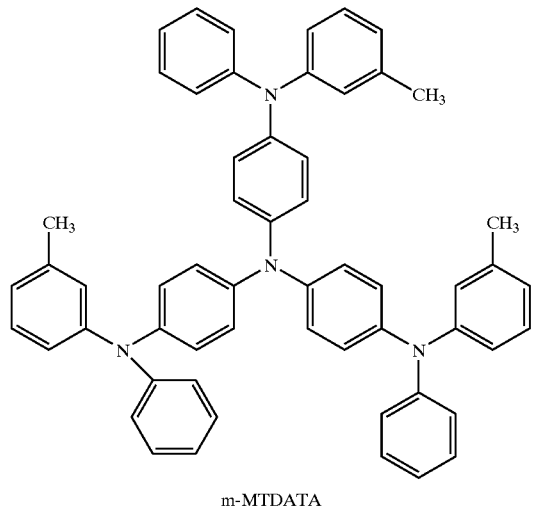

m-MTDATA

Figure 5:
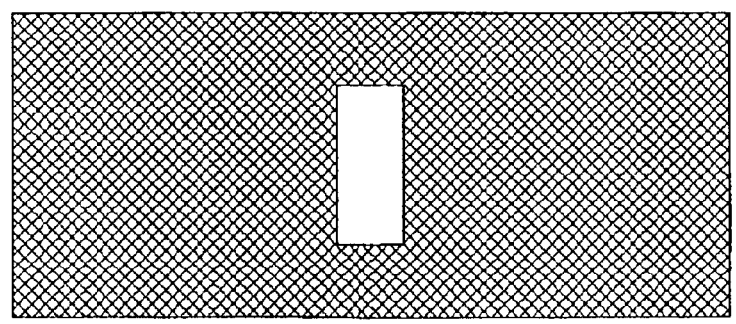
FIG. 5 shows a shadow mask.

Then, a shadow mask shown in FIG. 5 was placed on the resulting layer, and compound 2-1 and compound TPB (compound 2-1:TPB=95:5) were co-deposited through the shadow mask to obtain a blue light emission layer 22 with a thickness of 33 nm. After that, the shadow mask was laterally shifted, and compound 2-1 and compound cumarin 6 (compound 2-1:cumarin=97:3) were co-deposited through the shadow mask to obtain a green light emission layer 23 with a thickness of 33 nm. After that, the shadow mask was further laterally shifted, and compound 2-1 and compound DCM II (compound 2-1:DCM II=97:3) were co-deposited through the shadow mask to obtain a red light emission layer 24 with a thickness of 33 nm.

Then, the shadow mask was removed, and compound 4-9 was deposited on the entire surface of the resulting layer to obtain a hole blocking layer 29 with a thickness of 10 nm. Further, Alq3 was deposited on the entire surface of the resulting layer to obtain an electron transporting layer 25 with a thickness of 40 nm.

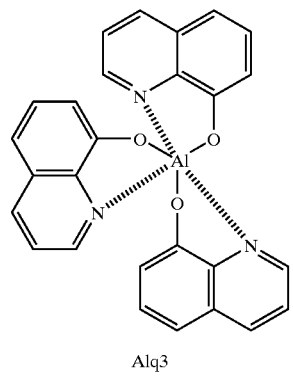

Alq3

Figure 8:
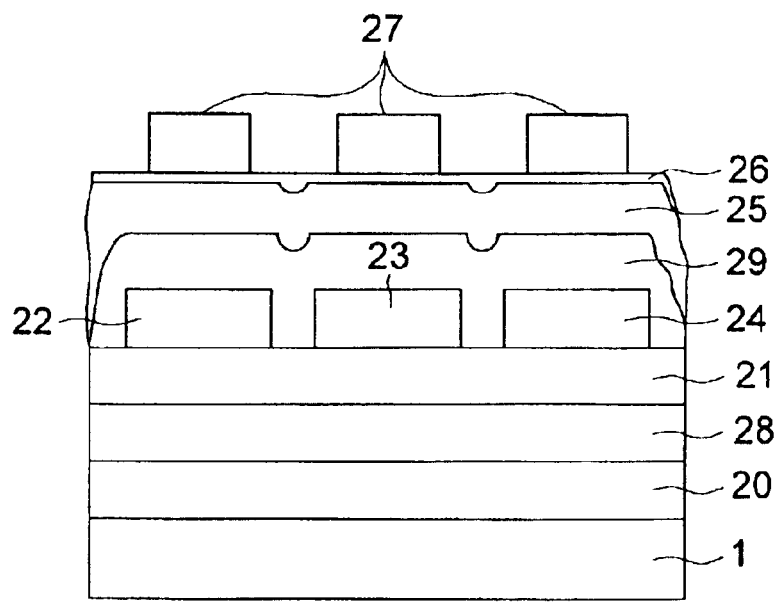
FIG. 8 shows another layer structure of a multicolor light emission apparatus in the invention.

Next, LiF was deposited on the entire surface of the resulting electron transporting layer to obtain an electron injecting layer 26 with a thickness of 0.5 nm. Finally, a shadow mask shown in FIG. 6 was placed on the resulting electron injecting layer 26, and Al was deposited through the shadow mask to obtain a cathode 27 with a thickness of 200 nm. Thus, a multicolor light emission apparatus sample No. 2, as shown in FIG. 8, was prepared.

The maximum fluorescence wavelength of compound m-MTDATA was 429 nm, that of compound 3-21 (hole transporting layer) 393 nm, that of compound 2-1 (host compound in the light emission layer) 398 nm, and that of compound 4-9 395 nm, that of Alq3 520 nm, each being measured as a layer. Regarding the emission properties of the multicolor light emission apparatus sample prepared above, the maximum emission wavelength of the blue light emission element was 440 nm, that of the green light emission element was 510 nm, and that of the red light emission element was 580 nm.

Example 3

A multicolor light emission apparatus sample No. 3 was prepared in the same manner as in Example 2, except that only the host compound in the red light emission layer was changed to compound 3-1.

The maximum fluorescence wavelength of compound 3-1, which was measured as a layer, was 385 nm. Regarding the emission properties of the multicolor light emission apparatus sample prepared above, the maximum emission wavelength of the blue light emission element was 440 nm, that of the green light emission element was 510 nm, and that of the red light emission element was 580 nm.

Example 4

An ITO layer with a thickness of 200 nm was deposited on a glass substrate 1 to form an anode 20 (a sheet resistance of 30 Ω/□) in the same manner as in Example 1. Compound m-MTDATA was deposited on the anode employing a vacuum deposition method to obtain a hole injecting layer 28 with a thickness of 30 nm. Subsequently, compound 3-1 was deposited on the resulting layer employing a vacuum deposition method to obtain a hole transporting layer 21 with a thickness of 30 nm. Then, a shadow mask shown in FIG. 5 was placed on the resulting layer, and compound 3-1 and compound TPB (compound 3-1:TPB =95:5) were co-deposited through the shadow mask to obtain a blue light emission layer 22 with a thickness of 33 nm. After that, the shadow mask was laterally shifted, and compound 3-1 and Ir(ppy)$_3$ (compound 3-1:Ir(ppy)$_3$=95:5) were co-deposited through the shadow mask to obtain a green light emission layer 23 with a thickness of 33 nm.

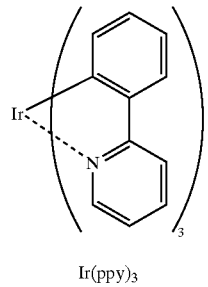

Ir(ppy)₃

After that, the shadow mask was further laterally shifted, and compound 3-1 and compound Ir(btp)₂(acac) (compound 3-1:Ir(btp)₂(acac)=95:5) were co-deposited through the shadow mask to obtain a red light emission layer 24 with a thickness of 33 nm.

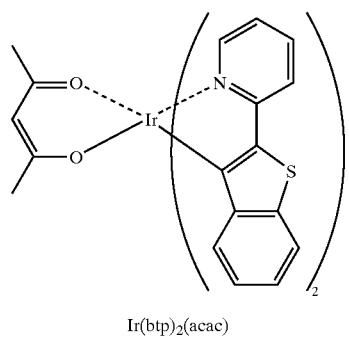

Ir(btp)₂(acac)

Then, the shadow mask was removed, and compound 4-9 was deposited on the entire surface of the resulting layer to obtain a hole blocking layer 29 with a thickness of 10 nm. Further, Alq3 was deposited on the entire surface of the resulting layer to obtain an electron transporting layer 25 with a thickness of 40 nm.

Next, LiF was deposited on the entire surface of the resulting electron transporting layer to obtain an electron injecting layer 26 with a thickness of 0.5 nm.

Figure 6:
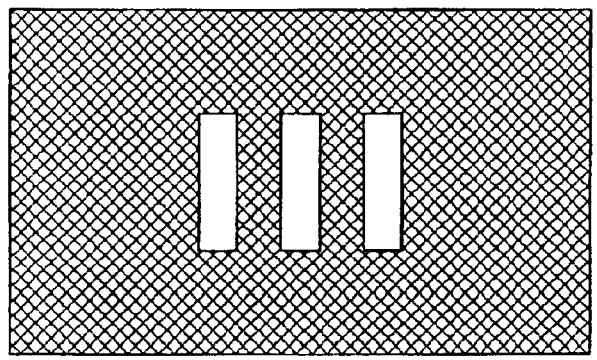
FIG. 6 shows a shadow mask for forming a cathode.
Figure 7:
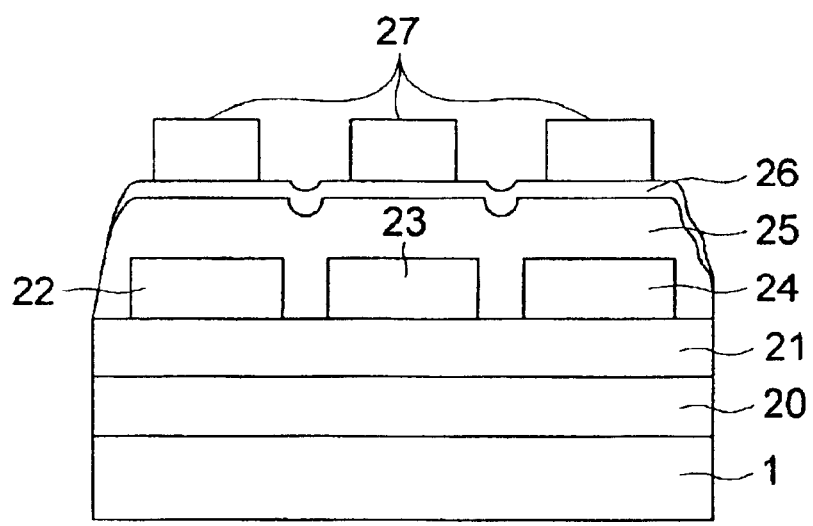
FIG. 7 shows a layer structure of a multicolor light emission apparatus.
Figure 9:
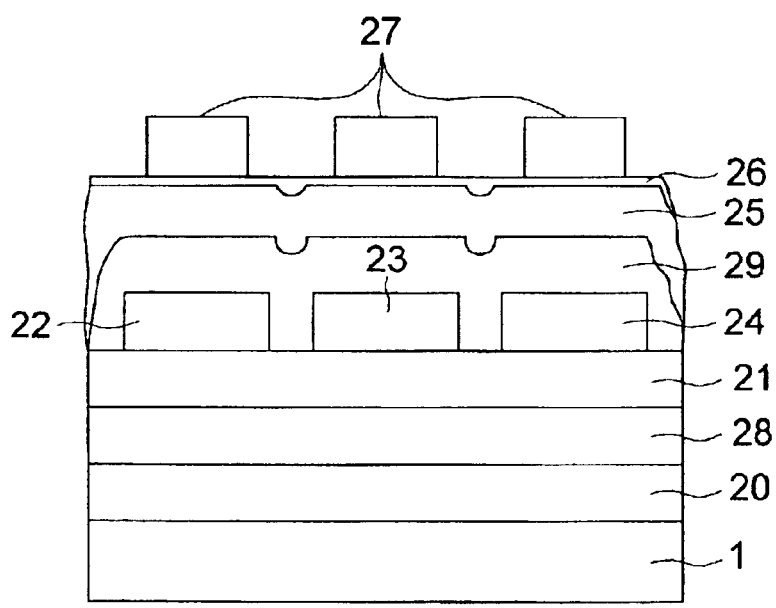
FIG. 9 shows further another layer structure of a multicolor light emission apparatus in the invention.

Finally, a shadow mask shown in FIG. 6 was placed on the resulting electron injecting layer 26, and Al was deposited through the shadow mask to obtain a cathode 27 with a thickness of 200 nm. Thus, a multicolor light emission apparatus sample No. 4, as shown in FIG. 9, was prepared.

The maximum fluorescence wavelength of compound m-MTDATA was 429 nm, that of compound 3-1 385 nm, that of compound 4-9 395 nm, and that of Alq3 520 nm. Regarding the emission properties of the multicolor light emission apparatus sample prepared above, the maximum emission wavelength of the blue light emission element was 440 nm, that of the green light emission element was 525 nm (the green light emission element has plural emission peaks at 525 nm and 545 nm, the 525 nm peak being higher in the green light emission element), and that of the red light emission element was 615 nm.

Example 5

A multicolor light emission apparatus sample No. 5 was prepared in the same manner as in Example 1, except that the layer thickness of each of the red, green and blue light emission layers was changed to 15 nm.

Regarding the emission properties of the multicolor light emission apparatus sample prepared above, the maximum emission wavelength of the blue light emission element was 440 nm, that of the green light emission element was 510 nm, and that of the red light emission element was 580 nm.

Example 6

A multicolor light emission apparatus sample No. 6 was prepared in the same manner as in Example 1, except that TPB was replaced with compound Fir(pic), compound 2-1 and compound Fir(pic) (compound 2-1:Fir(pic)=93:7) were co-deposited, cumarin 6 was replaced with Ir(ppy)₃, compound 2-1 and Ir(ppy)₃ (compound 2-1:Ir(ppy)₃=93:7) were co-deposited, DCM II was replaced with Ir(bpt)2(acac), and compound 2-1 and Ir(bpt)2(acac) (compound 2-1: Ir(bpt)2 (acac)=93:7) were co-deposited.

Regarding the emission properties of the multicolor light emission apparatus sample prepared above, the maximum emission wavelength of the blue light emission element was 475 nm, that of the green light emission element was 525 nm, and that of the red light emission element was 615 nm.

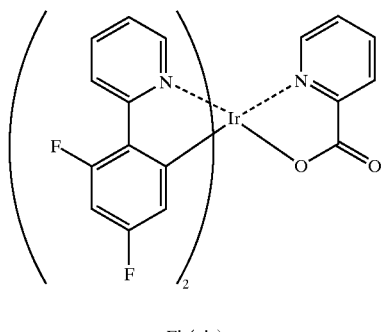

Fir(pic)

Comparative Example 1

An ITO layer with a thickness of 200 nm was deposited on a glass substrate 1 to form an anode 20 (a sheet resistance of 30 Ω/□). Then, a shadow mask shown in FIG. 5 was placed on the anode, and compound m-MTDATA was deposited on the anode 20 through the mask employing a vacuum deposition method to obtain a hole injecting layer 28 with a thickness of 20 nm. Subsequently, compound TPD was deposited on the resulting layer employing a vacuum deposition method to obtain a hole transporting layer 21 with a thickness of 60 nm. Then, compound DPVBi and compound BCzVbi (DPVBi:BCzVBi=97:3) were co-deposited through the shadow mask to obtain a blue light emission layer 22 with a thickness of 40 nm.

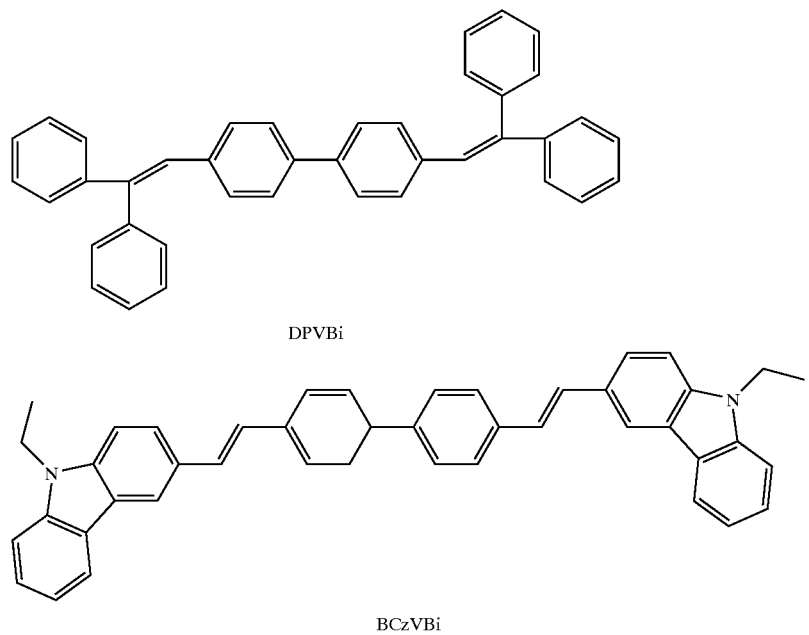

DPVBi

BCzVBi

Further, Alq3 was deposited on the resulting layer to obtain an electron transporting layer 25 with a thickness of nm. Thus, a blue light emission element was obtained. After that, the shadow mask was laterally shifted, and m-MTDATA was deposited on the anode to obtain a hole injecting layer 28, and further, a-NPD was deposited on the layer to obtain a hole transporting layer 21 with a thickness of 30 nm.

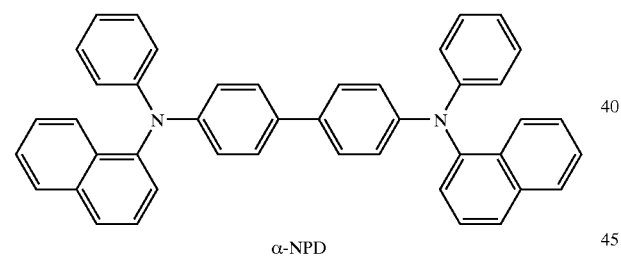

α-NPD

Compound CBP and Ir(ppy)$_3$ (compound CBP:Ir(ppy)$_3$= 95:5) were co-deposited on the resulting layer to obtain a green light emission layer 23 with a thickness of 20 nm.

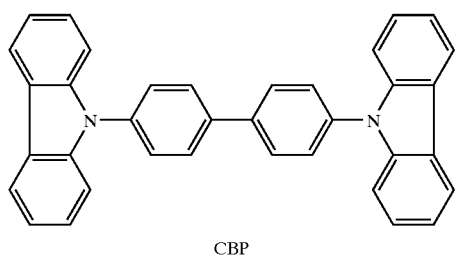

CBP

Next, BC was deposited on the resulting layer to obtain a hole blocking layer 29 with a thickness of 10 nm, and further Alq3 was deposited to obtain an electron transporting layer 25 with a thickness of 40 nm. Thus, a green light emission element was obtained.

After that, the shadow mask was laterally shifted, and m-MTDATA was deposited through the shadow mask to obtain a hole injecting layer 28 with a thickness of 20 nm. Further, α-NPD was deposited to obtain a hole transporting layer 21 with a thickness of 40 nm, and Bebq and DCM II (Bebq:DCM II=98:2) were co-deposited to obtain a red light emission layer 24 with a thickness of 30 nm.

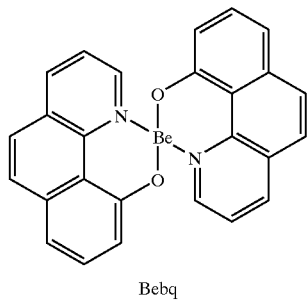

Bebq

Further, Alq3 was deposited on the resulting layer to obtain an electron transporting layer 25 with a thickness of 40 nm. Thus, a red light emission element was obtained.

Then, the shadow mask was removed, and LiF with a thickness of 0.5 nm was deposited on the entire surface of the resulting electron transporting layer.

Figure 10:
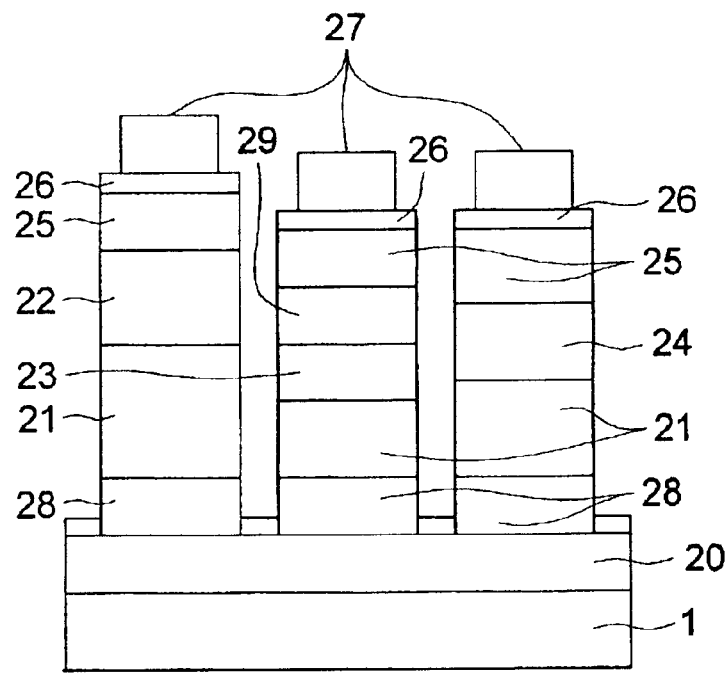
FIG. 10 shows a layer structure of a comparative multicolor light emission apparatus.

Finally, the shadow mask shown in FIG. 6 was placed on the resulting layer, and Al was deposited through the shadow mask to obtain an Al layer with a thickness of 200 nm. Thus, a multicolor light emission apparatus sample No. 7, as shown in FIG. 10, was prepared.

The maximum fluorescence wavelength of compound m-MTDATA was 429 nm, that of compound TPD 420 nm, that of DPVBi 460 nm, that of Bebq 515 nm, that of a-NPD 450 nm, that of CBP 405 nm, that of BC 398 nm, and that of Alq 520 nm. Regarding the emission properties of the multicolor light emission apparatus sample prepared above, the maximum emission wavelength of the blue light emission element was 460 nm, that of the green light emission element was 525 nm, and that of the red light emission element was 645 nm.

Comparative Example 2

A multicolor light emission apparatus sample No. 8 was prepared in the same manner as in Comparative Example 1, except that only the host compound in the red light emission layer was changed from Bebq to Alq3.

Comparative Example 3

An ITO layer with a thickness of 200 nm was deposited on a glass substrate 1 to form an anode 20 (a sheet resistance of 30 Ω/□). Compound m-MTDATA was deposited on the entire surface of the anode 20 employing a vacuum deposition method to obtain a hole injecting layer 28 with a thickness of 30 nm. Subsequently, α-NPD was deposited on the resulting layer to obtain a hole transporting layer 21 with a thickness of 30 nm.

Then, the shadow mask shown in FIG. 5 was placed on the resulting layer, and DPVBi and BCzVBi (DPVBi:BCZVBi=97:3) were co-deposited through the shadow mask to obtain a blue light emission layer 22 with a thickness of 40 nm. Next, the shadow mask was laterally shifted, and CBP and Ir(ppy)$_3$ (CBP:Ir(ppy)$_3$=95:5) were co-deposited to obtain a green light emission layer 23 with a thickness of 20 nm. Subsequently, the shadow mask was further laterally shifted, and Bebq and DCM II (Bebq:DCM II=98:2) were co-deposited to obtain a red light emission layer 24 with a thickness of 30 nm.

Then, the shadow mask was removed, and BC was deposited on the entire surface of the resulting layer to obtain a hole blocking layer 29 with a thickness of 10 nm. Further, Alq3 was deposited on the entire surface of the resulting layer to obtain an electron transporting layer 25 with a thickness of 30 nm, and LiF was deposited on the entire surface of the resulting layer to obtain a 0.5 nm thick LiF layer.

Figure 11:
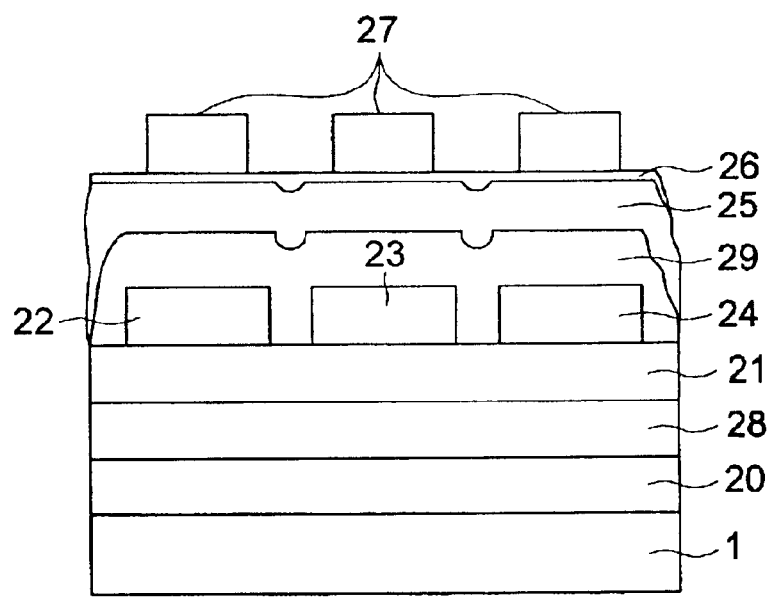
FIG. 11 shows another layer structure of a comparative multicolor light emission apparatus.

Finally, the shadow mask shown in FIG. 6 was placed on the resulting layer, and Al was deposited through the shadow mask to obtain a cathode 27 with a thickness of 200 nm. Thus, a multicolor light emission apparatus sample No. 9, as shown in FIG. 11, was prepared.

The maximum fluorescence wavelength of the M-MTDATA layer was 429 nm, that of the α-NPD layer 450 nm, that of the DPVBi layer 460 nm, that of the CBP layer 405 nm, that of the Bebq layer 515 nm, that of the BC layer 398 nm, and that of the Alq3 layer 520 nm. Regarding the emission properties of the multicolor light emission apparatus sample prepared above, the maximum emission wavelength of the blue light emission element was 460 nm, that of the green light emission element was 525 nm, and that of the red light emission element was 645 nm.

Constitution of the multicolor light emission apparatus sample Nos. 1 through 9 is collectively shown in the following table.

| Multicolor light emission apparatus sample No. | Number of layers | Number of compounds used | Frequency of depositions | Frequency of patternings |
|---|---|---|---|---|
| 1 (Inv.) | 9 | 6 | 5 | 3 |
| 2 (Inv.) | 15 | 8 | 7 | 3 |
| 3 (Inv.) | 15 | 8 | 7 | 3 |
| 4 (Inv.) | 15 | 8 | 7 | 3 |
| 5 (Inv.) | 9 | 6 | 5 | 3 |
| 6 (Inv.) | 9 | 6 | 5 | 3 |
| 7 (Comp.) | 13 | 11 | 13 | 3 |
| 8 (Comp.) | 13 | 11 | 13 | 3 |
| 9 (Comp.) | 15 | 10 | 7 | 3 |

Inv.: Inventive,
Comp.: Comparative

As is apparent from the above table, the inventive color light emission apparatus sample Nos. 1 through 6 is fewer in number of compounds used, when the number of layers is the same. In the inventive samples, the hole injecting layer, hole transporting layer, hole blocking layer, and electron transporting layer except for the light emission layer are common, and the common layers can be simultaneously deposited, resulting in reduction of frequency of depositions and of manufacturing time. On the contrary, sample Nos. 7 and 8, in which BGR elements are separately prepared, are extremely high in frequency of depositions, resulting in an increase of its manufacturing time.

In the multicolor light emission apparatus sample No. 8, light is emitted not only from the dopant but also from the Alq3 on the high voltage side, and the difference between chromaticity on the high voltage side and that on the low voltage side is observed, and Δxy is 0.022. In the red light emission element of the multicolor light emission apparatus sample No. 2 of the invention, the difference between chromaticity on the high voltage side and that on the low voltage side is 0.0086 in terms of Δxy. That is, the present invention provides a reduced color difference.

In Sample No. 9, the same host was not used as the common host compound in the light emission layer, and the number of compounds used increased. Further, in order to minimize the number of manufacturing processes, Sample No. 8 was prepared employing the same compound in the hole transporting layer and in the hole blocking layer to give light emission layers with the same thickness. The light emission from α-NPD, which was provided as the hole transporting layer of the blue light emission layer and the green light emission layer, was observed, resulting in color fluctuation.

Figure 12:
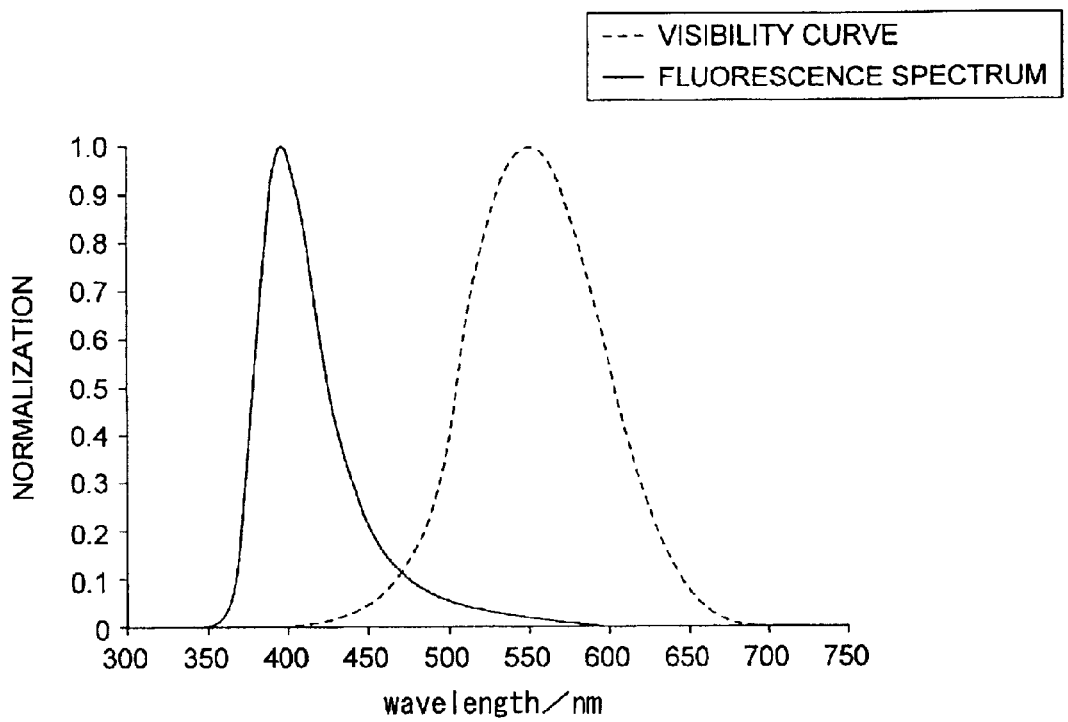
FIG. 12 shows a spectral curve of a host compound used in the multicolor light emission apparatus of the invention, and also shows a visibility curve.

Herein, the host used in the light emission layer in the invention has a maximum fluorescence wavelength of 398 nm which is at the extremely short wavelength regions, and is low in visibility. Accordingly, chromaticity is scarcely varied. FIG. 12 shows a spectral curve of compound 2-1 used as a host compound in the inventive multicolor light emission apparatus sample No. 2, and also shows a visibility curve. As is apparent from FIG. 12, both curves hardly overlap each other.

Figure 13:
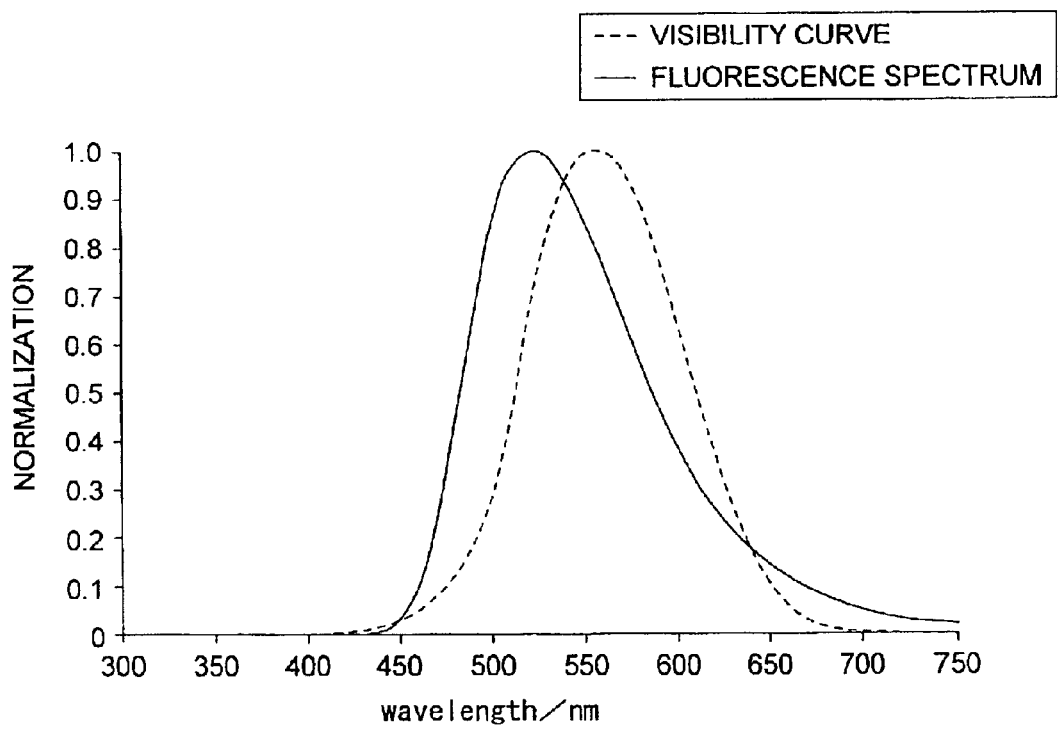
FIG. 13 shows a spectral curve of a red host compound generally used as a host compound in a conventional multicolor light emission apparatus, and also shows a visibility curve.

FIG. 13 shows a spectral curve of Alq3 used as a conventional red host compound in the conventional multicolor light emission apparatus sample No. 8, and also shows a visibility curve. As is apparent from FIG. 13, both curves almost overlap each other, which has a great influence on chromaticity.

As is apparent from the above, in the invention chromaticity is hardly varied even when light emission from the host compound is visible.

Each of the BGR emission elements in the multicolor light emission apparatus sample No. 2 of the invention was sealed in a tube under a dry nitrogen atmosphere, and a low current of 1 mA was supplied to each element to emit light. The half-lifetime of luminance of the emitted light was represented in terms of a relative value when that of G was set at 1.0. The results are as follows.
G: 1.0
B: 0.95
R: 0.90

The above results show no significant difference in lifetime among B, G, and R.

In the invention, the B, G and R emission elements have the same constitution except for the dopants, and the elements deteriorate through the same mechanism. Accordingly, the relative lifetime of the elements hardly varies. Thus, in the invention, the half lifetimes of BGR are almost the same, which is advantageous in designing a light source or an indicator such as a display.

Example 7

A display was manufactured as follows.

On an ITO substrate were formed 816 ITO transparent electrode stripes with a length of 90 mm and a width of 80 $\mu$m at a pitch of 100 $\mu$m.

The negative working liftoff photoresist (ZPN 1100 produced by Nippon Zeon Co., Ltd.) was coated on the resulting substrate to give a thickness of 3 $\mu$m. The photo-mask used for patterning the photoresist had openings with a width of 65 $\mu$m and a length of 235 $\mu$m, the openings being arranged at a pitch of 100 $\mu$m in the width direction and at a pitch of 300 $\mu$m in the length direction. The photo-mask was placed on the substrate so that the center in the width direction of a first electrode stripe was in accordance with that of the openings of the photomask, and then, patterning of the photoresist was carried out. The pattern shape of the liftoff resist was a reversed tapered shape.

Successively, a silicon oxide layer with a thickness of 150 nm was formed on the glass substrate employing an electron beam deposition method. The resulting substrate was subjected to supersonic cleaning in acetone to dissolve the liftoff resist, and the silicon oxide layer, which had been deposited at the openings of the resist, was formed on the first electrode. That is, insulating layers having a width of 65 $\mu$m and a length of 235 $\mu$m were arranged at a pitch of 100 $\mu$m in the width direction and at a pitch of 300 $\mu$m in the length direction, which had the same arrangement as the pattern of the photomask.

The resulting substrate was washed, subjected to UV-ozone cleaning, deposited with m-MDTAMA at a thickness of 30 nm as a hole injecting layer, and then deposited with compound 3-21 as a hole transporting layer at a thickness of 30 nm.

A shadow mask for a light emission layer comprised of nickel as a main component was placed on the front side of the substrate to be in close contact with the substrate, and a ferrite magnet (YBM-1B produced by Hitachi Kinzoku Co., Ltd.) was put on the rear side of the substrate. The shadow mask had openings at a pitch of 300 $\mu$m, and was placed on the front side of the substrate so that the openings were arranged on the ITO transparent electrode stripes every third electrode stripe. Firstly, a blue light (B) emission layer was formed. Compound 2-1 and TPB (Compound 2-1:TPB=95:5) were co-deposited to form a B emission layer with a thickness of 30 nm. Secondly, the shadow mask was laterally shifted by one pitch of the electrode, and a red light (R) emission layer was formed. Compound 2-1 and DCM II (Compound 2-1:DCM=96:4) were co-deposited to form an R emission layer with a thickness of 30 nm. Thirdly, the shadow mask was shifted by further one pitch of the electrode, and a green light (G) emission layer was formed. Compound 2-1 and cumarin 6 (Compound 2-1:cumarin 6=97:3) were co-deposited to form a G emission layer with a thickness of 30 nm. After that, compound 4-9 at a thickness of 10 nm was deposited on the light emission layer, Alq3 at a thickness of 30 nm was deposited thereon, and then LiF at a thickness of 0.5 nm was deposited thereon. Thus, a hole blocking layer, an electron transporting layer and an electron injecting layer were formed.

A shadow mask with openings for cathode patterning was prepared. The shadow mask had reinforcing materials on one side thereof to prevent deformation of the openings, and had the structure in which a space is formed between the substrate and the shadow mask with the reinforcing materials. The shadow mask had a size of 120 mm×84 mm, and a thickness of 150 $\mu$m. The shadow mask had 200 openings in the stripe form with a length of 100 mm and a width of 200 $\mu$m which were provided at a pitch of 300 $\mu$m. The shadow mask had, on the masked portions, reinforcing materials with a width of 40 mm and a thickness of 35 $\mu$m, which was of regular hexagon-shaped mesh structure with a distance between the opposite sides of 20 $\mu$m. The space distance was 150 $\mu$m, equal to the thickness of the shadow mask. The shadow mask was fixed with a stainless steel frame.

The shadow mask comprised of nickel as a main component was placed on the substrate perpendicularly to the transparent electrode, and a ferrite magnet (YBM-1B produced by Hitachi Kinzoku Co., Ltd.) was placed on the rear side of the substrate to fix the shadow mask. Then, aluminum at a thickness of 200 nm was deposited to form a cathode. Successively, the shadow mask was laterally shifted by 50 $\mu$m, and aluminum at a thickness of 200 nm was further deposited. That is, two depositions were carried out employing the shadow mask having openings with a width of 200 $\mu$m, whereby 200 electrodes in the stripe form with a width of 250 $\mu$m were provided at a pitch of 300 $\mu$m.

The display prepared above emitted R, G, and B light, separately, with a pixel having a size of 65×235 $\mu$m, and linearly successive driving of the display provided a clear pattern image and also a clear multicolor image.

This example is an example of a full color display due to a passive matrix driving, but may be applied to an example of a full color display due to an active matrix driving.

Example 8

The display prepared in Example 5 was power saving, and could be used as the light source of a full color electrophotographic copier.

The display could be also used in a room light or a light source for printers.

[Effect of the Invention]

The present invention can provide a multicolor light emission apparatus which is reduced in color fluctuation of emitted light due to driving voltage, and which is reduced in burden of the manufacture.

What is claimed is:

1. A multicolor light emission apparatus comprising:
 a first organic EL element having a first maximum emission wavelength in a blue light wavelength region; and
 a second organic EL element having a second maximum emission wavelength longer than the first maximum emission wavelength;

wherein the first organic EL element comprises a first light emission layer containing a first host and a first dopant, and a first adjacent layer containing a first compound and which is provide adjacent to one side of the first light emission layer, the second organic EL element comprises a second light emission layer containing a second host and a second dopant, and a second adjacent layer containing a second compound and which is provided adjacent to one side of the second light emission layer, wherein each of the first and second hosts has an emission wavelength region which is shorter than the blue light wavelength region; and each of the first compound and the second compound has a maximum emission wavelength of not longer than 415 nm.

2. The multicolor light emission apparatus of claim 1, wherein a maximum emission wavelength of the first and second hosts is not longer than 415 nm.

3. The multicolor light emission apparatus of claim 1, wherein the first host is the same as the second host.

4. The multicolor light emission apparatus of claim 1, wherein the apparatus comprises, as the second organic EL element, an organic EL element having a maximum emission wavelength in a green light wavelength region and an organic EL element having a maximum emission wavelength in a red light wavelength region, and wherein the apparatus is a display exhibiting an image by light emission from each organic element.

5. The multicolor light emission apparatus of claim 1, wherein the apparatus is a light source.

6. The multicolor light emission apparatus of claim 1, wherein the thickness of the first light emission layer is the same as that of the second light emission layer.

7. A method of manufacturing the multicolor light emission apparatus of claim 1, comprising the steps of simultaneously forming the hole transporting layer of each of the organic EL elements, separately forming the light emission layer of each of the organic EL elements, and simultaneously forming the electron transporting layer or the hole blocking layer of each of the organic EL elements.

8. The method of manufacturing the multicolor light emission apparatus of claim 7, wherein the method comprises the steps of simultaneously forming the hole transporting layer of each of the organic EL elements without employing a mask, forming the light emission layer of each of the organic EL elements, separately, employing a mask for patterning, and simultaneously forming the electron transporting layer of each of the organic EL elements without employing a mask.

9. The method of claim 8, wherein the hole transporting layer, the light emission layer, and the electron transporting layer are formed by a vacuum deposition method.

10. The method of claim 7, wherein the hole transporting layer, the light emission layer, and the electron transporting layer are formed by a vacuum deposition method.

11. The multicolor light emission apparatus of claim 1, wherein the first organic EL element further comprises a third adjacent layer containing a third compound, which is provided adjacent to another side of the first light emission layer; and the second organic EL element further comprises a forth adjacent layer containing a forth compound, which is provided another side of the second light emission layer;

wherein each of the third compound and the forth compound has an maximum emission wavelength of not longer than 415 nm.

12. The multicolor light emission apparatus of claim 11, wherein each of the first adjacent layer and the second adjacent layer is a hole transporting layer; and each of the third adjacent layer and the forth adjacent layer is a electron transporting layer.

13. The multicolor light emission apparatus of claim 11, wherein the thickness of the third adjacent layer and the forth adjacent layer is the same.

14. The multicolor light emission apparatus of claim 11, wherein the third compound is the same as the fourth compound.

15. The multicolor light emission apparatus of claim 1, wherein each of the first adjacent layer and the second adjacent layer is a hole transporting layer.

16. The multicolor light emission apparatus of claim 1, wherein each of the first adjacent layer and the second adjacent layer is a electron transporting layer.

17. The multicolor light emission apparatus of claim 1, wherein the thickness of the first adjacent layer and the second adjacent layer is the same.

18. The multicolor light emission apparatus of claim 1, wherein the first compound is the same as the second compound.

19. A multicolor light emission apparatus comprising:

a first organic EL element having a first maximum emission wavelength in a blue light wavelength region; and a second organic EL clement having a second maximum emission wavelength longer than the first maximum emission wavelength;

wherein the first organic EL element comprises a first light emission layer containing a first host and a first dopant, and a first adjacent layer containing a first compound, which is provided adjacent to one side of the first light emission layer, the second organic EL element comprises a second light emission layer containing a second host and a second dopant, and a second adjacent layer containing a second compound which is provide adjacent to one side of the second light emission layer, at least one of the first and second dopants is a phosphorescent compound, and wherein each of the first and second hosts has an emission wavelength region which is shorter than the blue light wavelength region; and each of the first compound and the second compound has a maximum emission wavelength of not longer than 415 nm.

20. The multicolor light emission apparatus of claim 19, wherein a maximum emission wavelength of the first and second hosts is not longer than 415 nm.

21. The multicolor light emission apparatus of claim 19, wherein the first host is the same as the second host.

22. The multicolor light emission apparatus of claim 19, wherein the first organic EL element further comprises a first hole transporting layer containing a first compound, which is provided adjacent to one side of the first light emission layer, and a first electron transporting layer containing a second compound, which is provided adjacent to another side of the first light emission layer, and the second organic EL element further comprises a second hole transporting layer containing a third compound, which is provided adjacent to one side of the second light emission layer, and a second electron transporting layer containing a fourth compound, which is provided adjacent to another side of the second light emission layer, wherein the first compound is the same as the third compound, and the second compound is the same as the fourth compound.

23. The multicolor light emission apparatus of claim 22, wherein the thickness of the first hole transporting layer is the same as that of the second hole transporting layer, and the thickness of the first electron transporting layer is the same as that of the second electron transporting layer.

24. The multicolor light emission apparatus of claim 22, wherein the maximum emission wavelength of the first and third compounds is not longer than 415 nm.

25. The multicolor light emission apparatus of claim 22, wherein the maximum emission wavelength of the second and fourth compounds is not longer than 415 nm.

26. The multicolor light emission apparatus of claim 19, wherein the apparatus comprises, as the second organic EL element, an organic EL element having a maximum emission wavelength in a green light wavelength region and an organic EL element having a maximum emission wavelength in a red light wavelength region, and wherein the apparatus is a display exhibiting an image by light emission from each organic element.

27. The multicolor light emission apparatus of claim 19, wherein the apparatus is a light source.

28. The multicolor emission apparatus of claim 19, wherein the phosphorescent compound is an iridium complex, a platinum complex or a europium complex.

29. A multicolor light emission apparatus comprising:

a first organic EL element having a first maximum emission wavelength in a blue light wavelength region and a second organic EL element having a second maximum emission wavelength longer than the first maximum emission wavelength, wherein the first organic EL element comprises a first light emission layer containing a first host and a first dopant, a first hole transporting layer containing a first compound, which is provided adjacent to one side of the first light emission layer, and a first electron transporting layer containing a second compound, which is provided adjacent to another side of the first light emission layer, and the second organic EL element comprises a second light emission layer containing a second host and a second dopant, a second hole transporting layer containing a third compound, which is provided adjacent to one side of the second light emission layer, and a second electron transporting layer containing a fourth compound, which is provided adjacent to another side of the second light emission layer, at least one of the first and second dopants is a phosphorescent compound, and wherein the maximum emission wavelength of the first and second hosts is not longer than 415 nm, the maximum emission wavelength of the first compound and the maximum emission wavelength of the third compound are not longer than 415 nm and are the same, and the maximum emission wavelength of the second compound and the maximum emission wavelength of the fourth compound are not longer than 415 nm and are the same.

30. The multicolor light emission apparatus of claim 29, wherein the first compound contained in the first hole transporting layer is the same as the third compound contained in the second hole transporting layer, and the second compound contained in the first electron transporting layer is the same as the fourth compound in the second electron transporting layer.

31. The multicolor light emission apparatus of claim 30, wherein the thickness of the first hole transporting layer is the same as that of the second hole transporting layer, and the thickness of the first electron transporting layer is the same as that of the second electron transporting layer.

32. The multicolor light emission apparatus of claim 31, wherein the thickness of the first light emission layer is the same as that of the second light emission layer.

33. The multicolor light emission apparatus of claim 29, wherein the first host is the same as the second host.

34. The multicolor light emission apparatus of claim 29, wherein the phosphorescent compound is an iridium complex, a platinum complex or a europium complex.

* * * * *